United States Patent
Vanka et al.

(10) Patent No.: US 7,870,468 B1
(45) Date of Patent: Jan. 11, 2011

(54) REED-SOLOMON DECODER USING A CONFIGURABLE ARITHMETIC PROCESSOR

(75) Inventors: Sundaram Vanka, Hyderabad (IN); Phanimithra Gangalakurthi, Hyderabad (IN)

(73) Assignee: Redpine Signals, Inc., San Jose, CA (US)

( * ) Notice: Subject to any disclaimer, the term of this patent is extended or adjusted under 35 U.S.C. 154(b) by 1264 days.

(21) Appl. No.: 11/441,596

(22) Filed: May 26, 2006

(51) Int. Cl.
*H03M 13/00* (2006.01)
(52) U.S. Cl. ..................................... 714/784
(58) Field of Classification Search .................. 714/784
See application file for complete search history.

(56) References Cited

U.S. PATENT DOCUMENTS 5,610,929 A * 3/1997 Yamamoto .................. 714/785
6,615,387 B1 * 9/2003 Williamson et al. ......... 714/785

* cited by examiner

*Primary Examiner*—Scott T Baderman
*Assistant Examiner*—Enam Ahmed
(74) *Attorney, Agent, or Firm*—File-EE-Patents.com; Jay A. Chesavage

(57) ABSTRACT

A Reed Solomon decoder utilizes re-configurable and re-usable components in a granular configuration which provides an upper array and a lower array of repeated Reconfigurable Elementary Units (REU) which in conjunction with a FIFO can be loaded with syndromes and correction terms to decode Reed Solomon codewords. The upper array of REUs and lower array of REUs handle the Reed Solomon decoding steps in a pipelined manner using systolic REU structures. The repeated REU includes the two registers, two Galois Field adders, a Galois Field multiplier, and multiplexers to interconnect the elements. The REU is then able to perform each of the steps required for Reed-Solomon decoder through reconfiguration for each step using the multiplexers to reconfigure the functions. In this manner, a reconfigurable computational element may be used for each step of the Reed-Solomon decoding process.

31 Claims, 25 Drawing Sheets

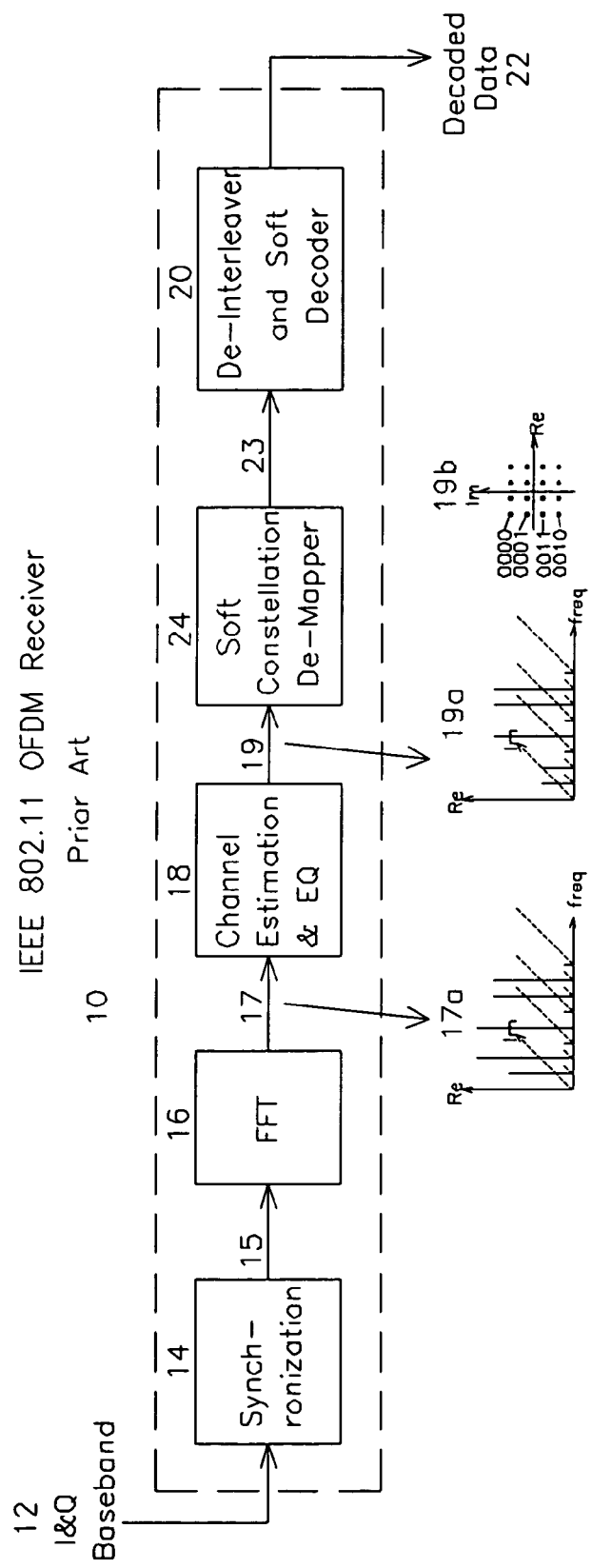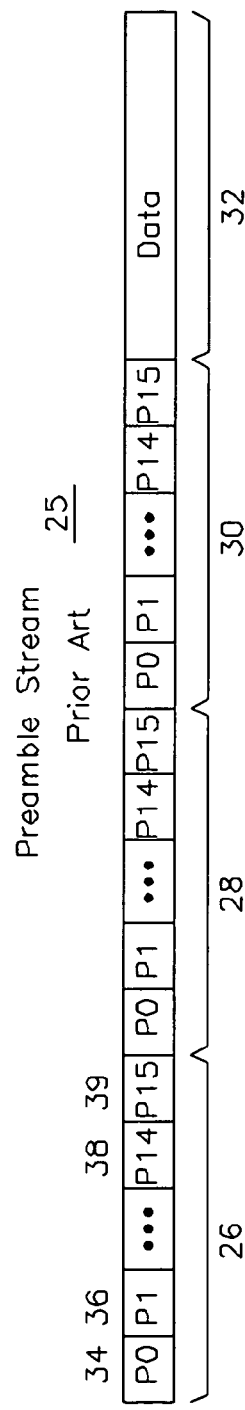

Packet Detection & Coarse Frequency Offset
Prior Art

Packet Detection
Prior Art

RAP & Data sources

Noise Estimator

2L Sample Accumulator

L sample Accumulator

GF Exponentiator

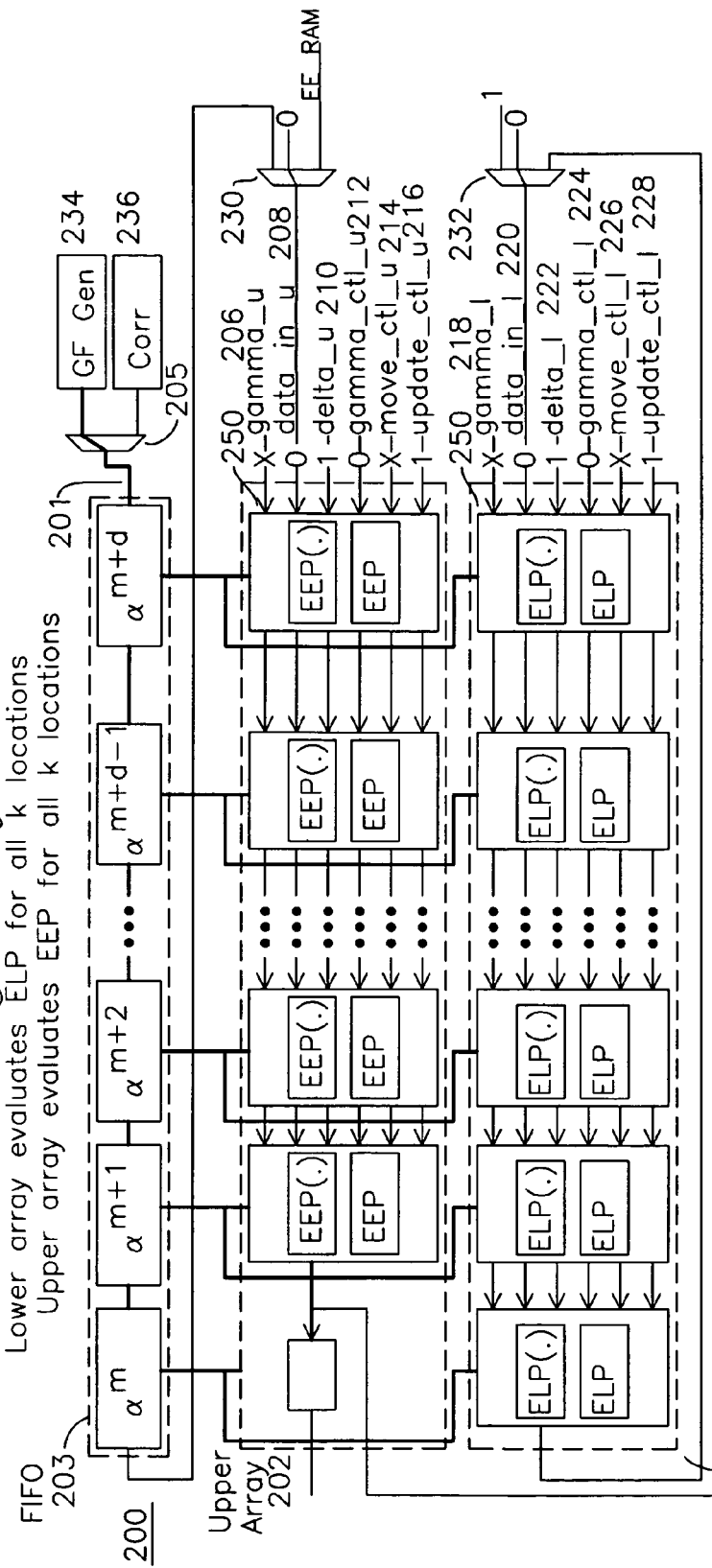

Polynomial Evaluation and 00,01 FIFO shift

Compute derivative of ELP

Lower Array evaluates derivative of ELP,
Upper Array exponentiates a given element to $(.)^{d-2}$
and multiplies with EE ram data FIFO: GF elements
Corr Reg: na
Upper Array: exponentiator for GF variables
Lower Array: Evaluate derivative of ELP $EXP_1 = (GF_0)^{d-2} \times$ EE Ram data$_0$
$EXP_2 = (GF_1)^{d-3} \times$ EE Ram data$_1$
$\cdots$
$EXP_{d-1} = (GF_{d-2})^{d-3} \times$ EE Ram data$_{d-2}$ Polynomial Computation using REU at start Polynomial Computation using REU after 1 cycle Polynomial Computation using REU after 2 cycles Polynomial Computation using REU after 3 cycles Computation of modified syndrome – at start of computation Computation of modified syndrome — after one clock cycle Polynomial Evaluation for arbitrary x,y,z: 1st clock Polynomial Evaluation for arbitrary x,y,z: 2nd clock

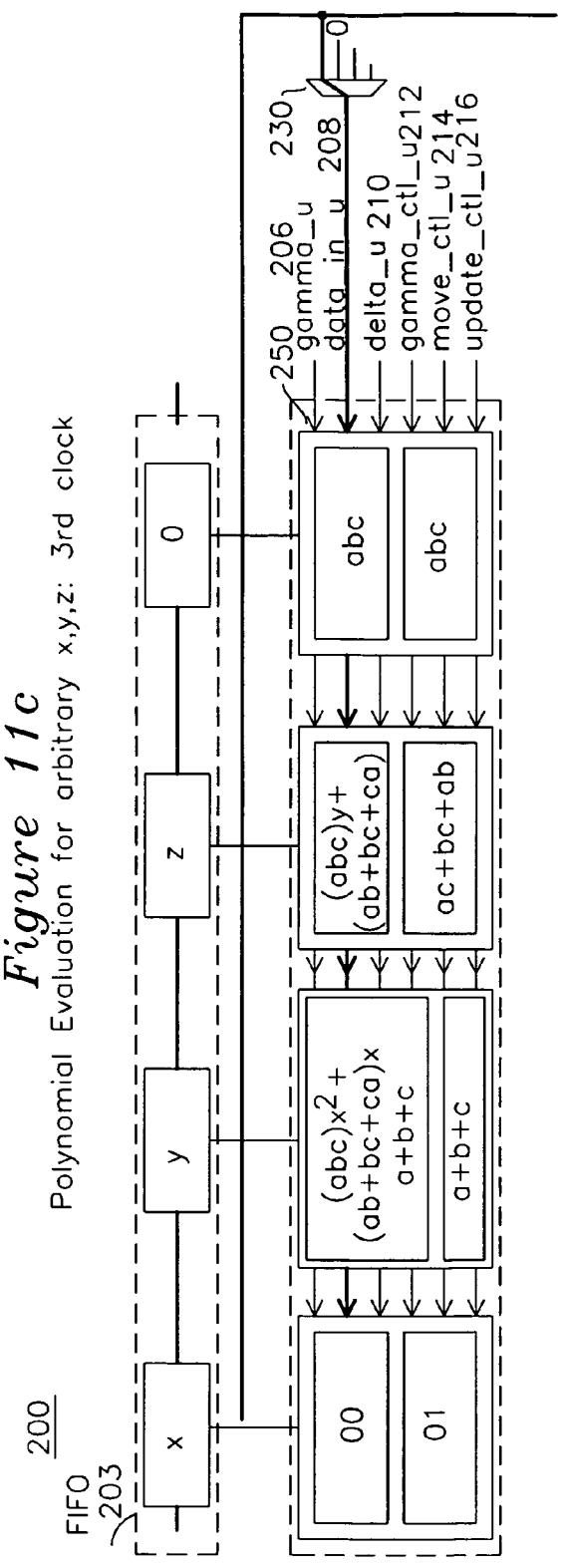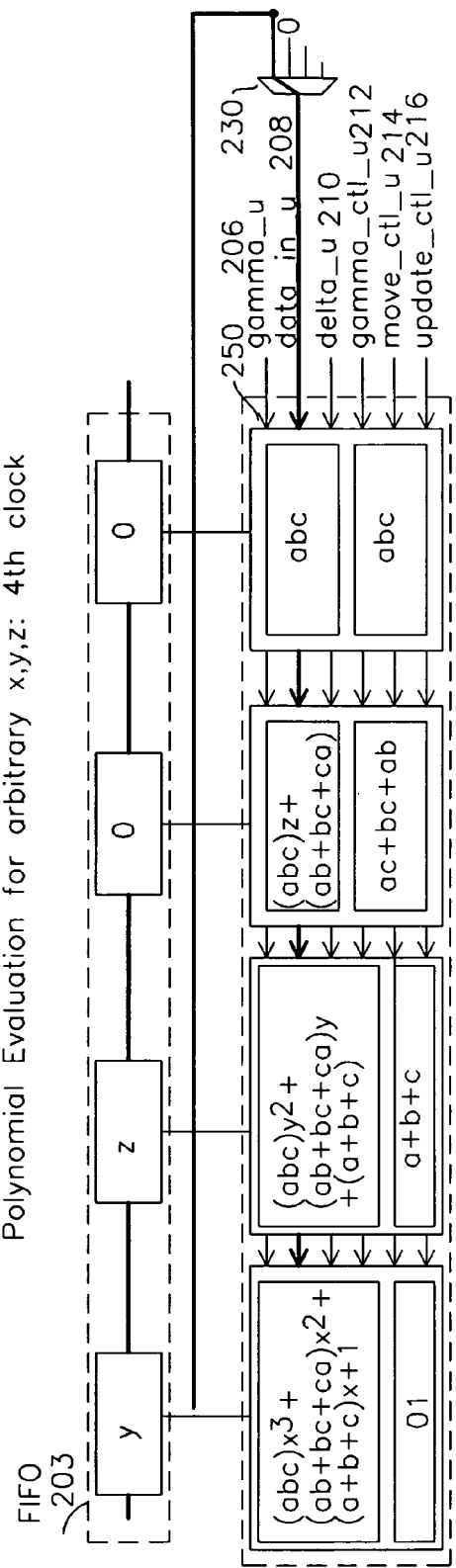

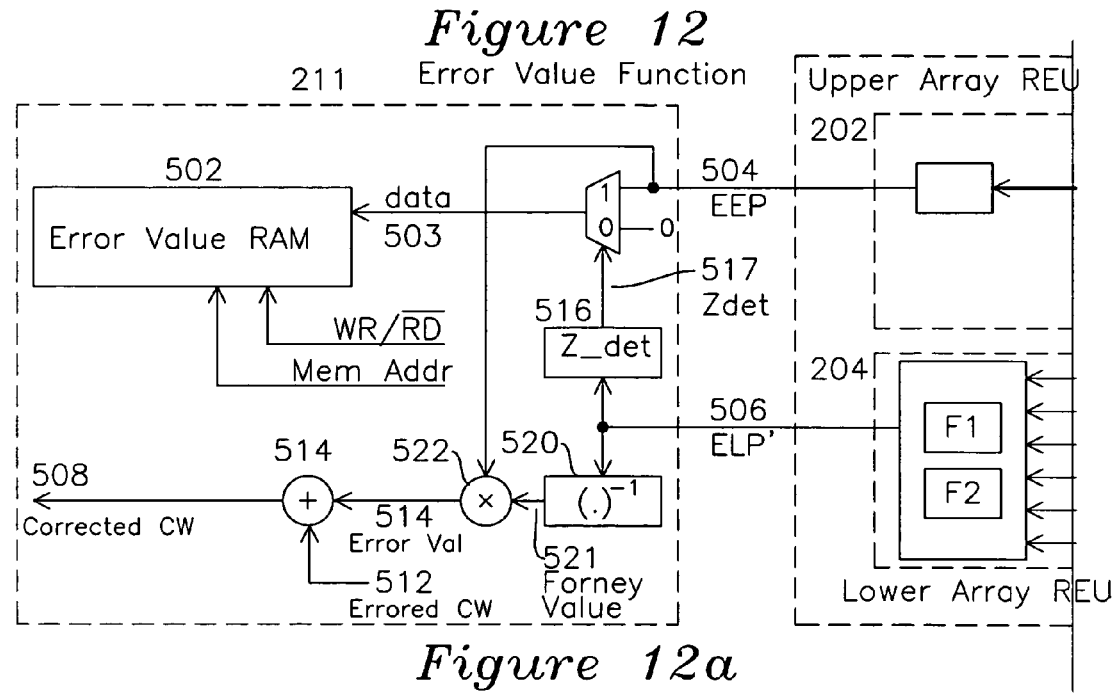

| Signal | ERROR LOCATION SEARCH | ERROR VALUE COMPUTATION & ERROR CORRECTION |
|---|---|---|
| 504 EEP | Evaluated value of EEP for a given valid GF element $\alpha^p$ where p is the position searched for. | |
| 506 ELP' | Evaluated value of ELP' for a given valid GF element $\alpha^p$ where p is the position searched for. | |
| 517 Zdet | If Zdet=1: ELP' is additive identity of [m_bit'0'] field GF(2m) | |
| 521 Forney | na | GF inverted value of Forney error value $= \left[ \Lambda' \alpha^{(.)} \right]^{-1}$ |
| 504 EEP | na | $x^{d-1} \Omega(x) \forall\ x \in \alpha^{sh},\ \alpha^{n-d+1}$ |
| 514 Err Val | na | $\left[ \alpha^{(.)} \right]^{16} \Omega\ \alpha^{(.)} \left[ \Lambda' \alpha^{(.)} \right]^{-1}$ |
| 512 Err CW | na | received codeword |
| 508 Cor CW | na | corrected codeword |
| 503 RAM data | EEP for errored data values written to RAM: $\Omega(.) \forall \Lambda(.)=0$ | not used? |

Figure 12b
Error Correction Sequence

| Step No: | 1 (Pre-processing) | | | 2 (Key Equation Solving) | | | |
|---|---|---|---|---|---|---|---|
| Total Clocks: | 1 | d | | s | 1 | d−s−1 | 1 |
| Step Name: | Initialization | UA: Corr Term Calc / LA: Compute EraLP | Output Results | UA: Modified Syndrome Computation | MS→KES Init (hidden) | KES | Init ELP Root Search (hidden) |
| Num Clocks: | 1 | d−2 (Fig 8b) | 1 (Fig 8c) | s | 1 (Fig 8d) | d−s−2 (Fig 8e) | 1 |
| UPPER | | | | | | | |
| data_in_u  208 | Data Out FIFO | Data Out FIFO | Data Out FIFO | 0 | 0 | 0 | 0 |
| delta_u    210 | 0 | 0 | 0 | data_out_u | data_out_u | data_out_u | data_out_u |
| gamma_u    206 | 1 | 1 | FIFO(i) | 1 | 1 | KES Logic | KES Logic |
| gamma_ctl_u 212 | 1 | 1 | 0 | 1 | 1 | 1 | 1 |
| move_ctl_u 214 | X | X | 1 | X | 1 | 0 | 1 |
| update_ctl_u 216 | X | X | 0 | 1 | 0 | KES Logic | 0 |
| LOWER | | | | | | | |
| data_in_l  220 | 1 | 0 | 0 | data_out_l | data_out_l | data_out_u | data_out_u |
| delta_l    222 | 0 | ERA 110 of fig 4 | ERA 110 of fig 4 | 0 | 0 | 0 | 0 |
| gamma_l    218 | 1 | 1 | 1 | 1 | 1 | KES Logic | KES Logic |
| gamma_ctl_l 224 | 1 | 1 | 1 | X | 1 | 1 | 1 |
| move_ctl_l 226 | 1 | 1 | 0 | 1 | 1 | 0 | 1 |
| update_ctl_l 228 | 0 | 0 | 0 | 1 | 0 | KES Logic | 0 |
| FIFO Contents | Syndromes shifted into UA (shifted by 1 clk) | Correction terms shifted in pushing syndromes into UA. | Correction Terms | na | na | na | Shift in GF elements starting with $\alpha^{sh}$ for error search |

Figure 12c
Error Correction Sequence

| Step No: | 3 (ELP Root Search) | | | 4 (Error Eval and Corr) |
|---|---|---|---|---|
| Total Clocks: | k+d+1 | | | k+d-1 |
| Step Name: | ES+EEP Polynomial Evaluation | Poly Eval + shift (hidden) | ELP Derivative Computation | Numerator error term calculation + ELP' evaluation + CW correction |
| Num Clocks: | k-1+d (Fig 8f) | 1 (Fig 8g) | 1 (Fig 8h) | k+d (Fig 8i) |
| data_in_u 208 | 0 | 0 | 0 | $\Omega(\cdot)$ from RAM |
| delta_u 210 | 1 | 1 | 0 | 0 |
| gamma_u 206 | FIFO(i) | 0 | FIFO(i) | FIFO(i) |
| gamma_ctl_u 212 | 0 | 1 | 0 | 0 |
| move_ctl_u 214 | x | x | 1 | x |
| update_ctl_u 216 | 1 | 1 | 0 | 1 |
| data_in_l 220 | 0 | 0 | 0 | 0 |
| delta_l 222 | 1 | 1 | 0 | 1 |
| gamma_l 218 | FIFO(i) | 0 | FIFO(i) | FIFO(i) |
| gamma_ctl_l 224 | 0 | 1 | 0 | 0 |
| move_ctl_l 226 | x | x | 1 | x |
| update_ctl_l 228 | 1 | 1 | 0 | 1 |
| FIFO Contents | Error locator possible roots | '00','01' pattern for differentiating ELP | | Those 'k' values where the error search was performed are shifted again through the FIFO |

Rows 208–216 are UPPER; rows 220–228 are LOWER.

KES LOGIC

REED-SOLOMON DECODER USING A CONFIGURABLE ARITHMETIC PROCESSOR

FIELD OF THE INVENTION

The present invention relates to the field of decoders for error correction coded information. More specifically, it relates to decoders for Reed Solomon error correction codes which are shortened, punctured, and erasure-marked. The present invention also relates to decoding architectures which use a plurality of identical processing elements formed into an array.

BACKGROUND OF THE INVENTION

The most widely used block codes in communication and storage systems are the Bose Chaudhari Hacquenghem (BCH) and the Reed-Solomon (RS) codes. A comprehensive review of BCH and RS codes and their encoders and decoders can be seen in the books "Error Control Coding Fundamentals and Applications" by Shu Lin and Daniel J Costello, Jr. and "Algebraic Codes for Data Transmission" by Richard Blahut.

Of the many decoding algorithms available to decode BCH and RS codes, the most widely used are the Berlekamp-Massey (BM) algorithm and the Euclidean algorithm (EA). Berlekamp and Massey contributed to the development of the BM algorithm, while Massey reinterpreted the decoding of BCH codes as a shift register synthesis problem. Subsequently, certain drawbacks of the original BM algorithm were addressed by Reed et al in "VLSI design of inverse-free Berlekamp-Massey algorithm", IEEE Proceedings, Sept 1991. The Euclidean Algorithm (EA) was developed by Sugiyama et al in "A method for solving key equation by decoding Goppa Codes", Information and Control, Jan 1975.

Before describing any of the algorithms, some properties of Galois Fields and cyclic codes should be defined.

Galois or Finite Fields: A field is a mathematical structure and forms a part of algebraic system. In general, a field is a set of elements in which we can perform addition, subtraction, multiplication and division without leaving the set. Addition and multiplication must satisfy the commutative, associative and distributive laws.

Finite fields are also called Galois fields. A large part of algebraic coding theory is built over finite fields. The number of elements in any finite field is either prime or the power of a prime. Just as the extension of the real number field yields the complex field, a "lower" finite field (containing fewer elements), can be extended to produce "higher" finite fields (containing more elements). Such a finite field is said to be an extension field of the lower field, also sometimes called the base field. Furthermore, it can be proven that the order of any finite field is a power of a prime 'p'. Thus, a GF(2) is a binary field and all of $GF(2^m)$ constitute the extension fields of the prime field GF(2). Extension fields are generated by first defining a primitive polynomial in the field as a generator polynomial, which can be further used for developing all the elements on the field which are all distinct.

Primitive Element: It has been proven that every finite field has a primitive element (which may not be unique). The primitive element can generate all non-zero elements of a finite field by repeated exponentiation. Every element of the finite field can be represented as a unique exponent of the primitive element.

Cyclic codes: A cyclic code has the property that a cyclic shift of one code forms another codeword. The word cyclic implies an LFSR like structure, in which an algebraic relation decides the feedback gains. These mathematical relations, ease the encoding and decoding process, thus attributing greater importance to this class of codes.

For a Reed-Solomon code (n,k,t) over GF $(2^m)$, $n=2^m-1$, k is odd, and the code can correct $t=(n-k)/2$ m-bit symbol errors. Any algorithm for decoding RS codes has to implicitly or explicitly perform these operations:

1) Compute errata locations;
2) Compute the errata values and correct the data.

These functions can be achieved by using a systematic or non-systematic encoding operation. Systematic encoding, as defined earlier, is an operation in which in an encoded codeword the data can be distinguished from the parity symbols in an encoded codeword. In the case of non-systematic encoding, the encoded codeword no longer shows up the data distinctly in the encoded codeword. The following equations indicate systematic and non-systematic encoding operations respectively.

The polynomial g(x) is called the generator polynomial of the code, which is defined as $$G(x) = \prod_{i=0}^{2t-1} (z - \alpha^i).$$

If the data polynomial is D(x) and the encoded polynomial is C(x), then $$C(x)=x^{n-k} \cdot D(x)+r(x)=q(x) \cdot G(x)$$

is called a systematic codeword, where q(x) is the quotient when $x^{n-k}d(x)$ is divided by g(x), whereas $$C(x)=D(x) \cdot G(x)$$

is called a non-systematic codeword. Most applications use systematic codewords, a restriction which also applies to the present patent application. As can be seen from the above, in both systematic and non-systematic encoding, the codeword polynomial is always divisible by the generator polynomial. Hence, all the roots of the generator polynomial are also roots of the codeword polynomial.

Due to the nature of the encoding operation, the received word, if same as the encoded codeword, yields a zero for all the roots of the generator polynomial. Since the generator polynomial has $2 \cdot t=d-1$ (d is the minimum distance of the codeword) roots, one can arrive at d−1 values for each root of the generator polynomial. These $2 \cdot t$ values are called the syndromes of the received codeword. With the $2 \cdot t$ syndromes a set of $2 \cdot t$ simultaneous equations can be formed. If the received codeword is R(x), which is $$R(x)=C(x)+E(x)$$

where $E(x)=e_{j0}+e_{j1}x+e_{j2}x^2+\ldots+e_{k(t-1)}x^{t-1}$ is the error due to the channel noise.

Then the syndromes are obtained as $$s_i=R(\alpha^i)=C(\alpha^i)+E(\alpha^i)=E(\alpha^i) \ \forall 0 \leq i \leq d-2$$

and the syndrome polynomial can be defined as $$S(x)=s_0+s_1x+s_2x^2+\ldots+s_{d-2}x^{d-2}$$

The decoding problem is that of finding the error locations and error values with the knowledge of the above syndromes. Following the syndrome computation step shown above, the Berlekamp-Massey (BM) algorithm results in the following steps after the calculation of syndromes to decode the received codeword:
1. Determine the Error Location Polynomial σ(x);
2. Determine the Error value evaluator;
3. Evaluate error-location numbers and error values and perform error correction.

Assuming that 't' errors are present in the data received at the input to the decoder, then the syndromes can also be shown as:

$$s_i = e_{j0} \cdot \alpha^{ij0} + e_{j1} \cdot \alpha^{ij1} + \ldots + e_{j(t-1)} \alpha^{ij(t-1)} \forall 0 \leq i \leq d-2$$

let $\beta_i \equiv \alpha^{ji}$ and $\delta_i \equiv e_{ji}$ then $$s_i = \delta_1 \cdot \beta_1^i + \delta_2 \cdot \beta_2^i + \delta_3 \cdot \beta_3^i + \ldots + \delta_v \cdot \beta_v^i \forall 0 \leq i \leq d-2$$

and the Error Locator Polynomial (ELP) can be defined as $$\sigma(x) = (1-\beta_1 x) \cdot (1-\beta_2 x) \ldots (1-\beta_v x) = \sigma_0 + \sigma_1 X^1 + \sigma_2 X^2 + \ldots + \sigma_v X^v$$

Where $\sigma_0 = 1$

The complete derivation can be found in the previous book reference by Lin and Costello, and the final result is computed from:

$$\sigma^{r+1} = \sigma^r - d_r \cdot d_\rho^{-1} \cdot X^{r-\rho} \cdot \sigma^{(\rho)}(X)$$

It can be clearly noticed that every update computation involves computation of inverse of the previous discrepancy. The error value can be found, once the Error Evaluator Polynomial is computed. The Error Evaluator Polynomial (EEP) defined as $$\Omega(x) = \Lambda(x) \cdot S(x) \bmod x^{2t}$$

The above equation is also known as the Key Equation.

The error value can be determined by Forney's error value formula given by:

$$e_i = \frac{\Omega(X_i^{-1})}{\Lambda'(X_i^{-1})}$$

where

Λ' is the formal derivative of the ELP. This error value can be used to correct the errors in data by reading the same error to cancel the existent error.

The inversion operation involving discrepancy computation slows down the iterative process. The inversion operation also significantly contributes to the critical path delay in VLSI implementations of the BM algorithm. Thus, higher throughputs would be possible if this inversion step is avoided.

As an improvement on the BM algorithm, an inversionless decoding method for binary BCH codes was described in the publication "Inversionless Decoding of Binary BCH Codes" by Reed et al in IEEE Transactions on Information Theory July 1971, to simplify the Berlekamp-Massey algorithm for the special case of binary BCH codes was developed. The VLSI architecture for inversionless decoding of Reed-Solomon codes (non-binary BCH codes) is shown in the prior art FIG. 1, where the error syndrome is input to register T 20. In the above architecture, the only input is the sequence of syndromes which are shifted into register T 20. The value of Λ from the solution of the key equation is loaded into register 30, and an iterative search for all values of k is undertaken until a match is found for the decoded codeword. FIG. 2 shows the flowchart for the prior art Berlekamp-Massey decoder of FIG. 1 using the "inversion-free" Berlekamp-Massey algorithm. A complete description of operation can be found in the Reed et al reference.

Although this algorithm eliminates the need for inversion, it does not include erasure decoding. Troung et al. (1998, 1999) have generalized this approach to include erasure handling. In this improvement, the concept of Forney's Syndromes was used, which is based on Erasure Location Polynomials (EraLP). In this method, the EraLP is computed and the modified syndromes are determined. This system takes advantage of the fact that the performance of a channel decoder can be improved by providing "side-information" about the 'reliability' of the demodulator estimate of every symbol received by the decoder. One simple way to accomplish this is to flag an "erasure" whenever the demodulator finds the symbol estimate unreliable. This indicates that the guess is purely arbitrary and it is to be disregarded by subsequent stages, as it is unreliable. Decoding with erasures improves performance, because it distributes the task of error correction between the demodulator and the decoder. Since symbols declared as erasures are usually in error, the process of generating erasures will convey the error location information to the decoder. It can be shown that for a code of minimum distance d, the maximum number of erasures that will guarantee correct decoding is d−1, assuming no other errors have occurred. FIG. 3 shows a block diagram that indicates the overall functionality of the RS decoder using inverse-free BM algorithm with erasure correcting capability.

The architectures for the prior art do not have a regular structure, as the mathematical operations involved are different in each of the stages, as can be seen for the various stages of FIG. 3:

Stage 1 (40 of FIG. 3): Iterative polynomial computation and erasure polynomial generation (optional, for erasure handling only)
Stage 2 (40 of FIG. 3): Key Equation Solver (KES)
 a) Discrepancy calculation—basically an FIR structure
 b) Polynomial update.
Stage 3 (42 of FIG. 3): Polynomial evaluation A very regular and systolic architecture for solving the Key Equation of the Berlekamp-Massey algorithm where no erasures are passed to the decoder was proposed by Sarwate et al in "High-Speed Architectures for Reed-Solomon Decoders" in IEEE Transactions on VLSI systems, Oct 2001. Through algorithmic transformations, the authors derived an architecture made up of a series of identical processing elements, which compute the discrepancies and updates simultaneously, contrary to a configuration where in different kinds of processing elements were used earlier. The design of the processing element was such as to significantly lower the critical path delay. The critical path delay was reduced and the number of computational iterations were also reduced, by look-ahead computations of the discrepancies. Sawate et al show that the error evaluation polynomial to be obtained is related to the contents of the upper array after the KES operation. Since the KES operation takes only 2t clock cycles, the extra t cycles required for computing the error evaluation polynomial are avoided. All previous implementations were designed such that the Error Locator Polynomial (ELP) α(x) was computed first and then the Error Evaluator Polynomial (EEP) Ω(x) was computed which was the product of the ELP α(x) and the syndrome polynomial S(x). This additional step represented overhead and extra clocks or more hardware was required.

The Euclidean Algorithm (EA) involves finding the Greatest Common Divisor (GCD) of two polynomials. This algorithm, which is also iterative, finds the discrepancy as the remainder when two polynomials are divided, and uses the same for the update of the ELP. Thus, the ELP is updated until the discrepancy vanishes, or until the decoding limit is reached. The Euclidean algorithm is conceptually elegant and architectures are usually regular, the details of this algorithm are described by in the Lin and Costello reference.

An architecture which incorporates the idea of a single processing unit was suggested by Iwamura et al in "A Design of Reed-Solomon Decoder with Systolic-Array Structure" in IEEE Transactions on Computers, Jan 1995. This architecture improves on earlier implementations by eliminating the need for separate design of different sets of Processing Elements (PE) for each decoding stage. This implementation proposes a simplified design by replication of a single versatile PE. This implementation exploits the fact that all the operations in the decoding process can be decomposed to the form a·b+c·d where a, b, c, d are all elements of $GF(2^m)$. The implementation is well suited for VLSI.

There are many disadvantages found in the Prior art Architectures:

The Massey implementation, described in "Shift-Register Synthesis and BCH decoding" in IEEE Transactions on Information Theory, Jan 1969, implements the decoding block Key Equation Solver (KES) as a Linear Feedback Shift Register (LFSR), whose gain is decided by the discrepancies computed in the previous clock cycle. The bottleneck in this implementation is the inversion arithmetic block in every discrepancy computation stage, which limits the speed of operation.

In Reed et al described above, the inversion was eliminated by computing another polynomial update, but the implementation had a MAC (multiply and accumulate) like structure, which had a large Critical Path Delay (CPD), on the order of $$\log\left[\frac{d-1}{2}\right]$$

XOR gates. The MAC structure operates on the syndromes to compute the discrepancy, which was used by the Error Locator Polynomial (ELP) update block. This CPD follows, as long as the Key Equation Solver is performed. This implementation does not handle decoding with erasures.

The above architectures are irregular and any change to make the same engine work for different configurations of (n, k), requires major changes in the design. Thus the prior art decoders are neither scalable nor systolic. The implementation in Sarwate et al described above uses the hardware inefficiently, as the same hardware can be reconfigured for multiple functionalities.

Since in all these implementations, the critical path delay (CPD) is due to the multipliers followed by the adder tree, Sarwate et al derived a systolic architecture for an errors-only RS decoder. The architecture has a reduced critical path delay, at the cost of extra computational complexity. Computation complexity increases because one extra update needs to be computed in every decoding step. The authors also show that performing iterations on the product of $S(x)\Lambda(x)$ yields a polynomial that is related to the EEP. Further, it is shown that this polynomial could also be used to compute the error magnitudes. It is also shown that $$\frac{\Omega(x)}{\Lambda'(x)} = \frac{x^{d-1}\Omega'(x)}{\Lambda'(x)}$$

where $\Omega(x)$ is the EEP as per the BM algorithm, and $\Omega'(x)$ is the polynomial obtained by Sarwate et al.

Zhang et al. (2002) improved upon the architecture of Sarwate et al by providing erasure-handling capability. Using one of the architectures derived by Sarwate et al, the present inventors have extended the idea to erasures-and-errors decoding. Moreover, much of the prior art is directed to the Key Equation Solver (KES) step, and derives optimized implementations for this step. It is desired that the different hardware blocks are used for other decoding steps, and if necessary, that all these units should operate as a pipeline.

The present invention describes a new processing unit, copies of which are connected to form a reconfigurable finite field arithmetic processor that can be used to perform multiple decoding steps.

There are several disadvantages of the prior art. In terms of regular reusable structure, the prior art architectures using the BM algorithm for errors-and-erasures decoding, generally do not contain reusable structures, which requires several unrelated structures for each stage of the decoder. In terms of hardware efficiency, the prior art BM implementations have concentrated on optimizing the KES step in the decoding process. In terms of implementation, it is always possible to reduce the hardware complexity by time-sharing of a limited number of processing units. Thus, the hardware efficiency is achieved only at a given decoding step—the optimization is seldom done across decoding steps. For example, the Chien root search and Error evaluation decoding steps, which are often the most time-consuming steps in the decoding process, do not have a straightforward mapping onto the KES hardware. The prior art of Sarwate et al has underutilized hardware, as the KES block has 6t GF multipliers for just 2t clocks. The GF multiplier is a gate intensive element having at least 130 gates.

The prior art inversionless architectures, including all features such as errors and erasure decoding, are either non-systolic or semi-systolic (all prior architectures, and Zhang et al. (2002)). Additionally, the prior art decoders do not handle Shortened and punctured codewords, and the prior art decoders have large critical path delay, although reduced in recent implementations and further improved in Sarwate and Zhang et al.

With regard to Patent Prior Art, the following references are noted which describe the individual processing elements of Reed-Solomon decoders:

Finite field multipliers are described in U.S. Pat. Nos. 4,216,531 by Chiu, 5,272,661 by Raghavan et al, and in 6,230,179 by Kworkin et al. U.S. Pat. Nos. 5,818,855 by Foxcraft and 6,473,799 by Wolf describes Galois Field multipliers.

There are several polynomial evaluation architectures in the prior art, including U.S. Pat. Nos. 5,751,732 and 5,971,607, both by Im.

U.S. Pat. No. 5,787,100 by Im describes a system for calculating the error evaluator polynomial in a Reed-Solomon decoder. U.S. Pat. Nos. 5,805,616 by Oh and 5,878,058 by Im describe systems for calculating an ELP and EEP, including support for punctured and shortened codes.

Reed-Solomon decoder systems which incorporate the previously described elements can be found in U.S. Pat. Nos. 6,587,692 by Zaragoza, 6,487,691 by Katayama et al, 6,553,537 by Jukuoka, 6,694,476 by Sridharan et al, U.S. application Ser. Nos. 2002/0023246 by Jin, 2003/0229841 by Kravtchenko, 2003/0135810 by Hsu et al, and 2003/0126542 by Cox.

OBJECTS OF THE INVENTION

A first object of the invention is an inversionless systolic Reed-Solomon decoder with re-usable computational elements. Additionally, it is desired for the Reed-Solomon decoder to handle errors and erasures, as well as to be re-configurable for use with shortened and punctured codewords.

A second object of the invention is a Processing Unit for use in a Reed-Solomon decoder.

A third object of the invention is an arrangement of Processing Units in an upper array and a lower array for use in a Reed-Solomon decoder.

A fourth object of the invention is a process for performing Reed-Solomon decoding.

SUMMARY OF THE INVENTION

The present invention is an apparatus to decode a (n,k,d) Reed Solomon code with support for punctured and shortened codes. The main architectural blocks are a syndrome block and an RAP block. The Syndrome block evaluates a set of 'd−1' syndromes, as it receives data from a demodulator. The syndrome block also updates a stack of erasure locations as the demodulator reports them. The Reconfigurable Arithmetic Processor (RAP) can be configured to perform all the subsequent decoding steps. These include:

1a) deriving the Erasure Locator Polynomial (ELP);
1b) Correcting the Syndromes to account for shortening and/or puncturing.
2a) computing the modified syndromes for the solving the key equation;
2b) finding the solution to the key equation;
3a) root search
3b) Derivative computation, and
4) error evaluation.

This is accomplished with the help of additional hardware such as a First-In-First-Out (FIFO) buffer, the GF element generator (Gfgen), and the Exponentiator.

The following operations are performed in a sequential manner by the RAP. The time consumed for each of the operations in terms of number of clock cycles is as indicated. The RAP has two arrays formed by stacking 'd−1' Reconfigurable Elementary Units (REU) in the upper array and 'd' REUs in the lower array. After the syndromes are loaded into the FIFO (a II correction term ($\alpha^p$) is shifted into as shown in FIG. 8a)

1a) in the next 'd−1' clocks
  a. In the lower array, the Erasure Location Polynomial (EraLP) is computed,
  b. In the upper array, the syndromes are shifted in.
  c. Into the FIFO, the correction terms for the syndromes are shifted in.
1b) In the $d^{th}$ clock, the correction, required as per the shortening and puncturing lengths is applied to all the syndromes, with the help of the FIFO.
2a) For next 's+1' clock cycles: The lower array cyclically shifts in the Erasure Locator Polynomial (EraLP), computed in the previous operation while giving the same values one at a time to the upper array, while the upper array computes the modified syndromes. The last clock cycle is used for initializing the engine for the KES operation.

2b) For next 'd−1−s' clocks (KES operation) The lower array computes the Errata Locator Polynomial (ELP), having started with the EraLP. The upper array, computes the Error Evaluator Polynomial (EEP) starting with the modified syndromes. One clock, after the completion of the computations, is spent in backing up the evaluated polynomials for further operations. This idle cycle can be avoided by scheduling this update in the last cycle of KES operation, and is therefore not shown in FIGS. 12b and 12c 3a) For next 'k−1+d' clocks The lower array evaluates the ELP for all the 'k' data locations. The upper array evaluates the EEP for all the 'k' data locations. The first 'd' clocks are spent shifting the GF elements into the FIFO.

3b) The following 'd' clocks, a 0×01 (multiplicative identity of the Finite field), 0×00(additive identity of the Finite field) sequence is shifted into the FIFO. Both the arrays are not expected to give any useful data for this time. These clock cycles can be saved by scheduling this load operation in the final 'd' clocks of the root search process. Consequently, these d clocks are not explicitly shown in FIGS. 12b and 12c.

3c) For the next '2' clocks (The derivative of the ELP is computed) as follows:

First the ELP coefficients located in F2 registers of LA are shifted into corresponding F1 registers. In the next clock the derivative is computed using the FIFO elements, shifting the derivative into F2 register of next REU. The derivative computation can be initiated while shifting the last evaluated value of ELP out of the LA. Therefore, just one more cycle is necessary to complete the derivative computation process. This is shown in FIGS. 12b/c. The derivative of the ELP is stored in the lower array, and that of the EEP discarded. The upper array is further used as an exponentiator.

4a) For next 'k+d' clocks, the derivative of the ELP is evaluated (lower array) and the numerators of possible error terms are computed (upper array). The lower array evaluates the derivative of the ELP. The upper array exponentiates a given finite field element to its $d-1^{th}$ exponent and computes its product with the evaluated value of EEP (evaluated values of EEP were computed in the previous step) for that particular finite field element. The correction to be applied to the received data is obtained by evaluating the Forney's error value formula as follows. The output of the lower array 204 is inverted with the help of a finite field inverter unit. Along with the output of the upper array 202, corresponding inverted values from the lower array are input to a finite field multiplier. The result of the multiplication operation is the error magnitude, which is then used to correct the input data stream.

BRIEF DESCRIPTION OF THE DRAWINGS

FIG. 1 shows the block diagram for a prior art Modified Berlekamp-Massey Algorithm.

FIG. 2 shows a flowchart for a prior art Reed Solomon decoder.

FIGS. 8a through 8i shows the functional steps and intermediate computational results for the RAP of FIG. 5 at various steps of the computation.

FIGS. 11a through 11d show the configuration and computation details for the polynomial evaluation of FIG. 8f.

FIG. 12 shows the error value function of FIG. 5.

FIG. 12a shows the operation and contents of FIG. 12.

FIGS. 12b and 12c show the pipeline operation and control and data inputs for the processor of FIG. 5 as applied to the processing steps of FIGS. 8a through 8i.

DETAILED DESCRIPTION OF THE INVENTION

Figure 3:
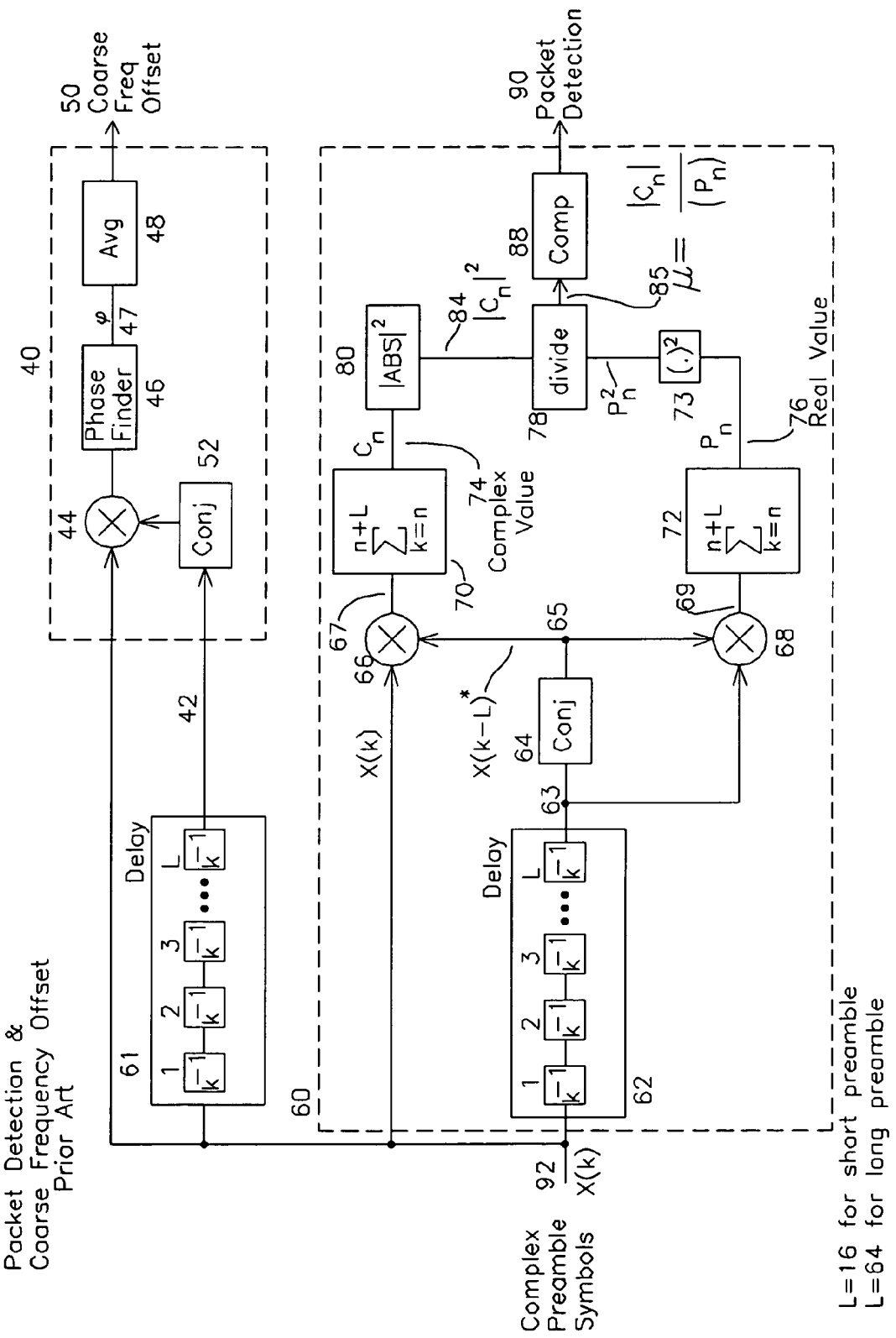
FIG. 3 shows a block diagram for a prior art Reed Solomon decoder with erasures.
Figure 4:
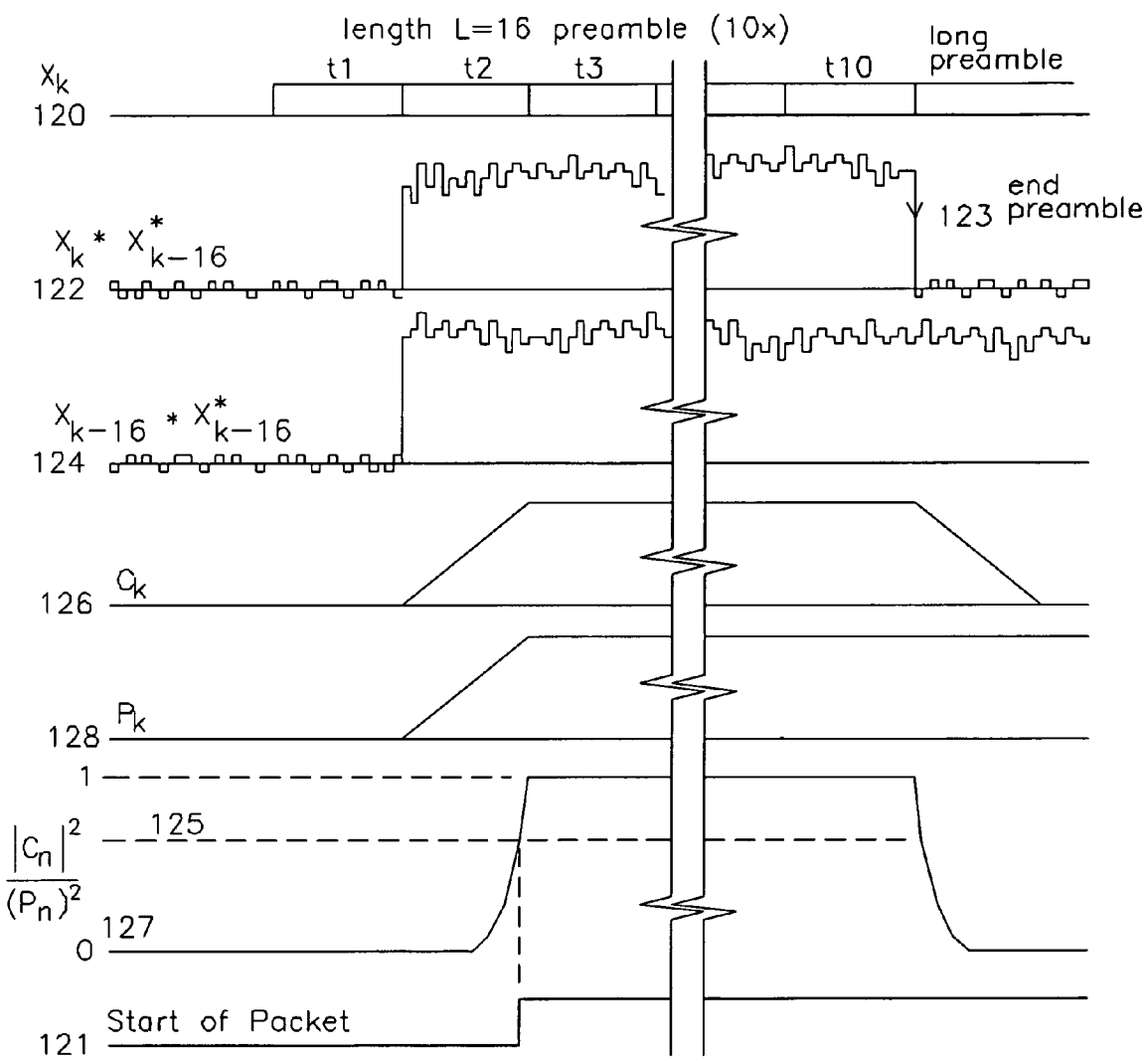
FIG. 4 shows the Reed Solomon decoder of the present invention.

FIG. 4 shows the block diagram for the decoder 100 of the present invention. Incoming data 102 is qualified by input_valid 104 and erasure_flag 106, which indicate receipt of valid data and erasure of input data, respectively. Input data 102 is applied to the Syndrome Computer 108, which constitutes the first pipeline stage whose implementation remains the same irrespective of data input configuration and the shortening and/or puncturing length. The syndrome computer (SC) 108 uses erasure_flag 106 and passes this information to erasure marker 110, which stacks the inverse exponent of erasure location(s) as the Syndrome Computer 108 declares them. Processing occurs in discrete time intervals separated by a pipeline boundary 122, which separates the processing into a first pipeline 124 comprising the Syndrome Computer 108 and Erasure Marker 110, and a second pipeline 126 comprising the Reconfigurable Arithmetic Processor (RAP) 112. The page select 116 and associated memories 118 and 120 are used for storing results generated by the each pipeline. One such page such as 118 may used for storing results generated by Syndrome Computer 108 and erasure marker 110, and the other page 120 may be used for results generated by the RAP 112. In this manner, results from processors in each pipeline may be shared at the end of each computation stage.

Figure 5:
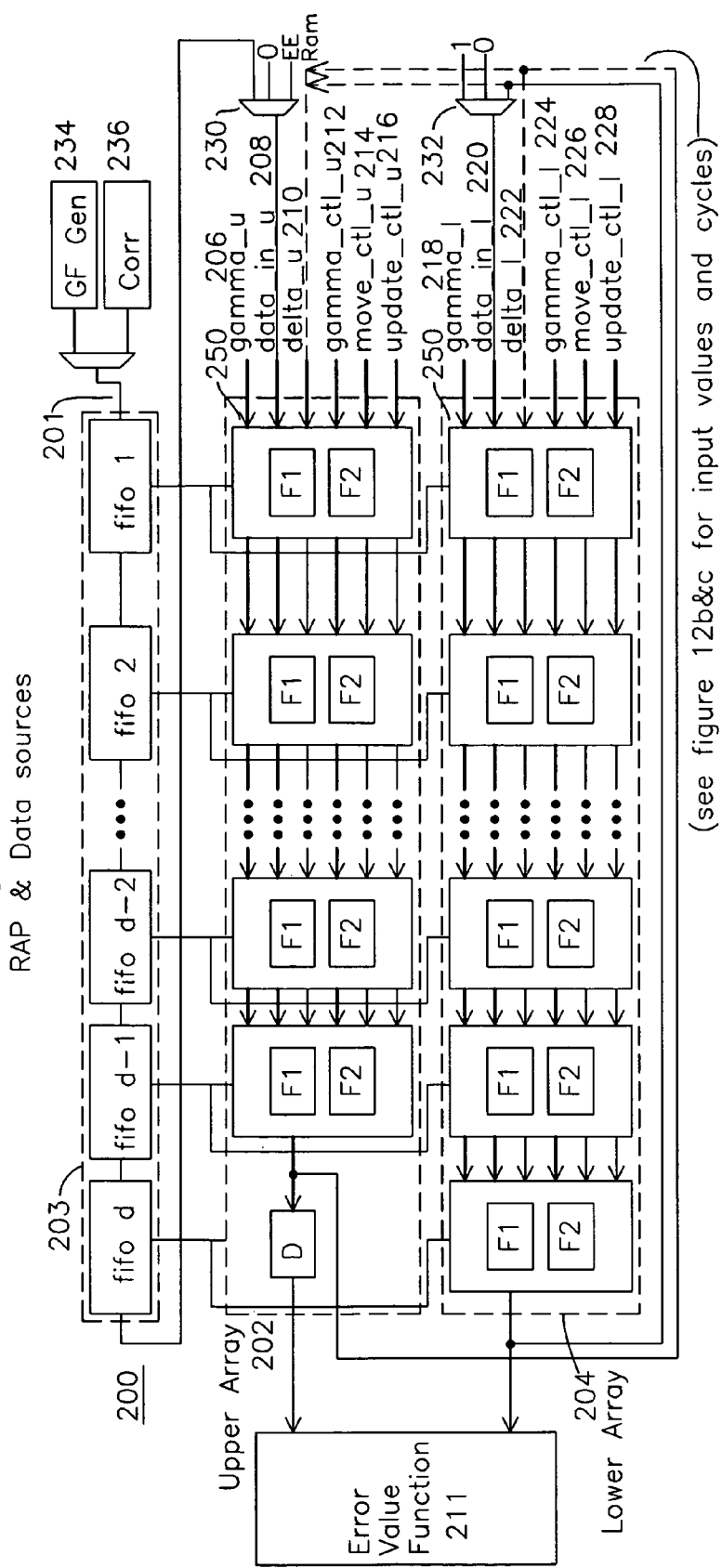
FIG. 5 shows a block diagram for the Reconfigurable Array Processor (RAP) of FIG. 4.
Figure 5A:
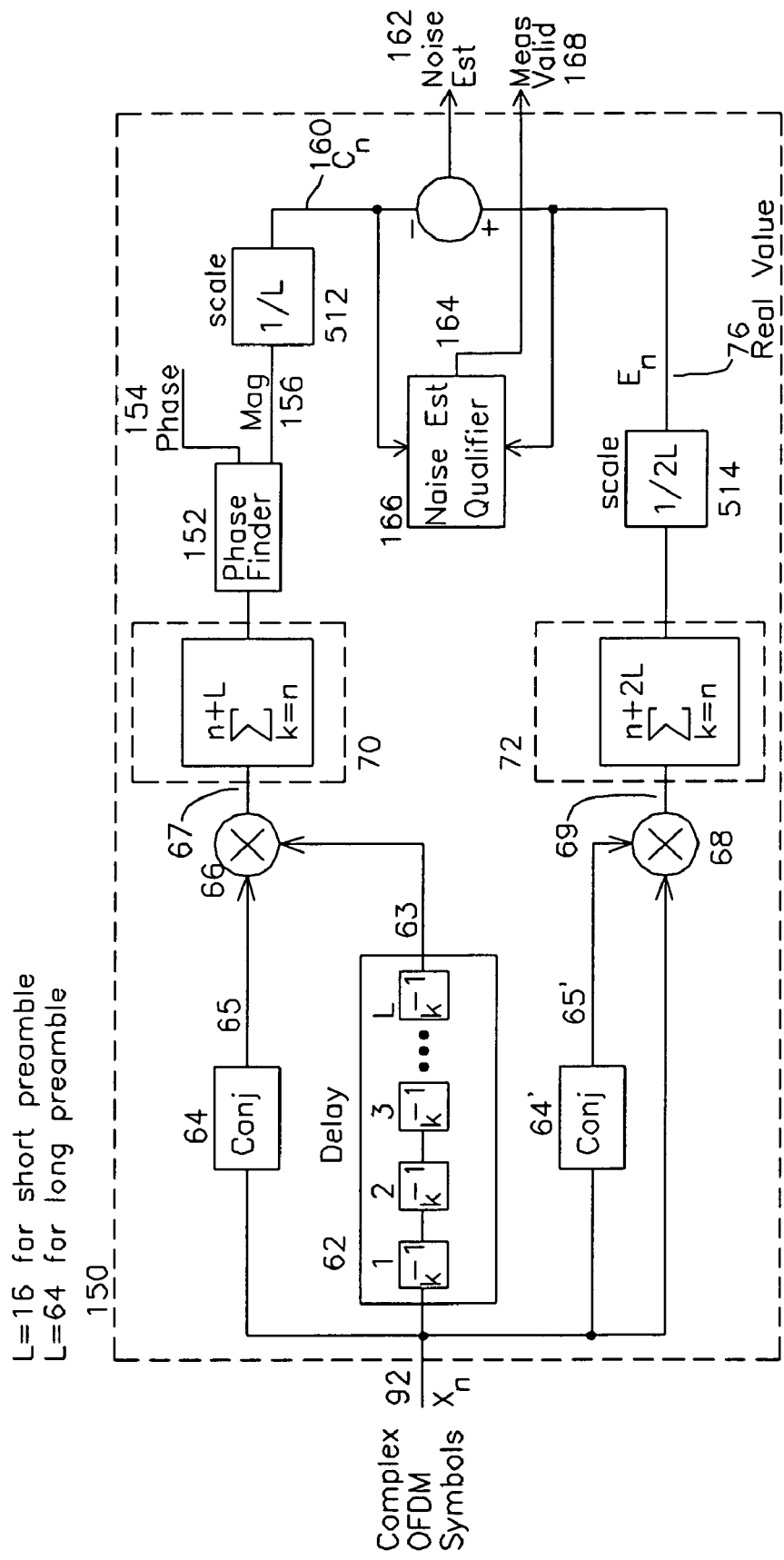
Figure 5C:
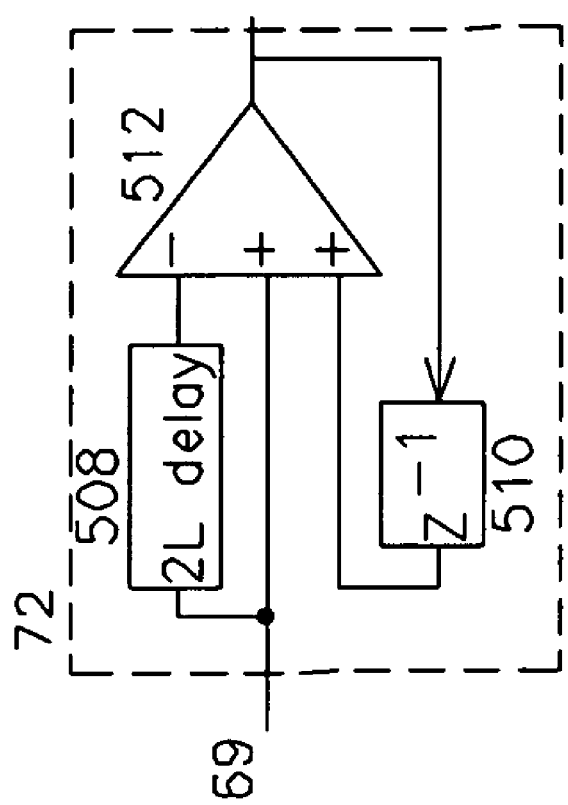
Figure 5B:
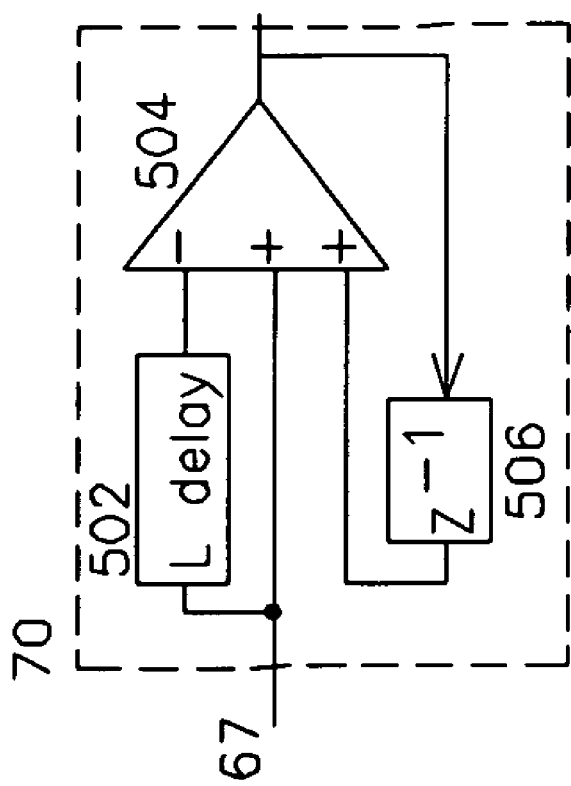

The Reconfigurable Array Processor (RAP) 112 of FIG. 4 is shown in detail in FIG. 5. The RAP 200 is designed such that it has two virtually identical arrays, which are formed by interconnection of a number of Reconfigurable Elementary Units (REU) 250 for each of the arrays as shown. The upper array 202 has 'd−1' REUs 250 and the lower array 204 has 'd' REUs 250. The REUs are designed in such a way as to perform all the post syndrome computation functions by configuring the same blocks to different configurations by a control bus extended to all the REUs in both the arrays. Each REU 250 is an identical structure for the upper and lower arrays, and the REUs 250 of the upper array share several common busses, which provide data and control information. The shared data busses of the upper array 202 are gamma_u 206 and delta_u 210. Data_in_u 208 is not bussed, but is sequentially fed from Data_out (260 of FIG. 6) to the data_in_u (249 of FIG. 6) of the next unit 250. In this upper chain 202 of REUs 250, the first REU is sourced through a controllable multiplexer 230. The multiplexer 230 selects one of the following data sources: the output of the FIFO 203, a 0 value, or the EE RAM output. Similarly, the shared control busses of the upper array 202 operate the multiplexers of the REU 250, as will be described later, and include the signals gamma_ctl_u 212, move_ctl_u 214, and update_ctl_u 216. The shared data busses of the lower array 204 are gamma_l 218 and delta_l 222. Data_in_l 220 is not bussed, but is sequentially fed from Data_out (260 of FIG. 6) to the data_in_u (249 of FIG. 6) of the next unit 250 of the lower array 204 of FIG. 5. In the lower chain 204 of REU 250, the first REU is sourced through a controllable multiplexer 232. The multiplexer 232 selects one of the following data sources: a 0 value, a 1 value, or the output of the lower array 204. The shared control busses of the lower array 204 operate the multiplexers of the REU 250, as will be described later, and include the signals gamma_ctl_l 224, move_ctl_l 226, and update_ctl_l 228.

Figure 6:
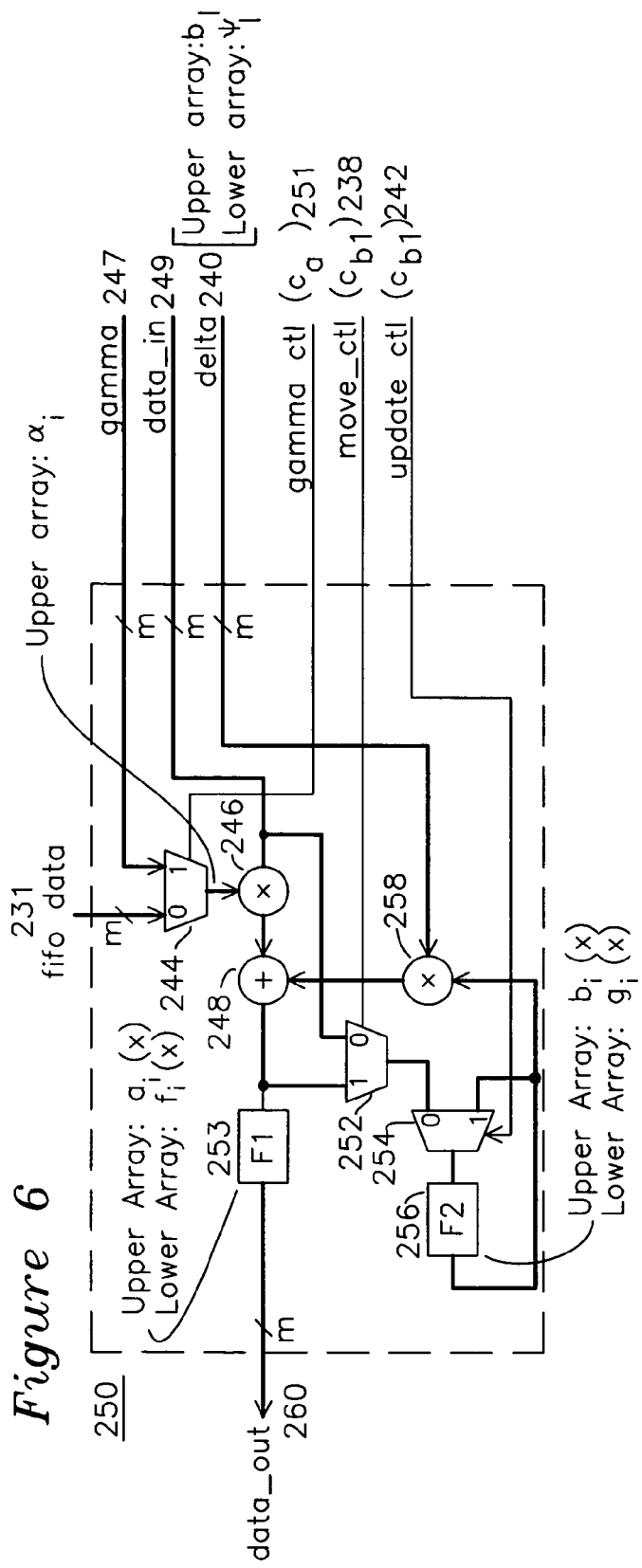
FIG. 6 shows the block diagram for the Reconfigurable Elementary Unit (REU) of FIG. 5.
Figure 7:
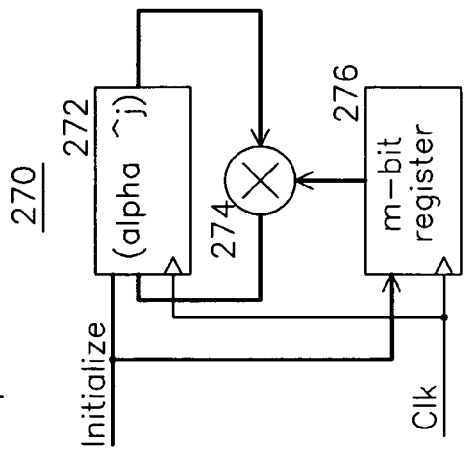
FIG. 7 shows the block diagram for a Galois Field (GF) Exponentiator.

FIG. 6 shows one of the REUs 250 from FIG. 5, which has two m-bit registers indicated as F1 253 and F2 256. These are wired in such a way that either the data in the F2 register can be fed back into itself via multiplexer 254 or GF multiplied (with GF multiplier 258) with a desired value delta 240, which is common to the whole of the array, and this product can be given to the GF_adder 248. The other input to the GF_adder 248 is the output of the GF_multiplier 246, which multiplies the data input 249 with the data 231 from the FIFO or gamma 247. Gamma 247 is common to all REUs 250 in both the arrays.

The FIFO input 201 of FIG. 5 is multiplexed between a GF-generator 234 and a correction generator 236. When initialized, the GF generator 234 runs freely to generate one Galois field element every clock with increasing exponent. The correction generator 236 generates a correction term as per the shortening and/or puncturing configuration, to reduce any hardware overhead in the SC block, compensating the shortening and/or puncturing. The correction generator can be initialized with any required field element.

The detailed steps of operation are shown in FIGS. 8a through 8i, which show the specific RAP elements, the inter-element communications, and the register values at intermediate stages. The RAP operation, register contents, and control signal values are also shown in FIGS. 12b and 12c. The control and data values for each step are shown in the FIGS. 8a-8i, and these signals may ordinarily be provided by a state controller as known to one skilled in the art.

Figure 8A:
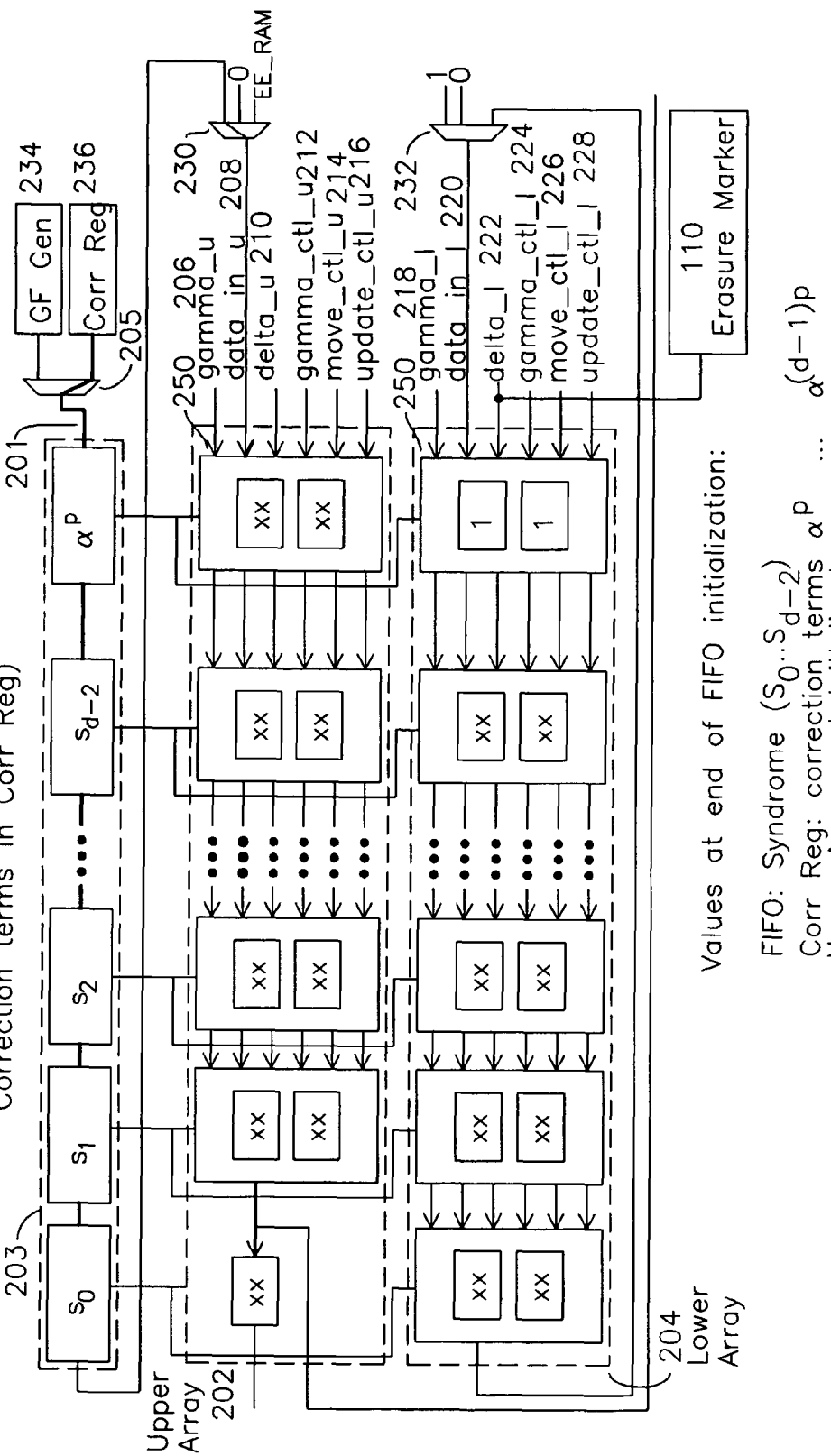

FIG. 8a shows the initial condition at the instant before the decoding steps start. The syndromes $s_0$-$s_{d-2}$ are placed in FIFO 203 using any means available, while the correction terms $\alpha^p \ldots \alpha^{(d-1)p}$ are generated serially using correction term generation logic 236.

Figure 8B:
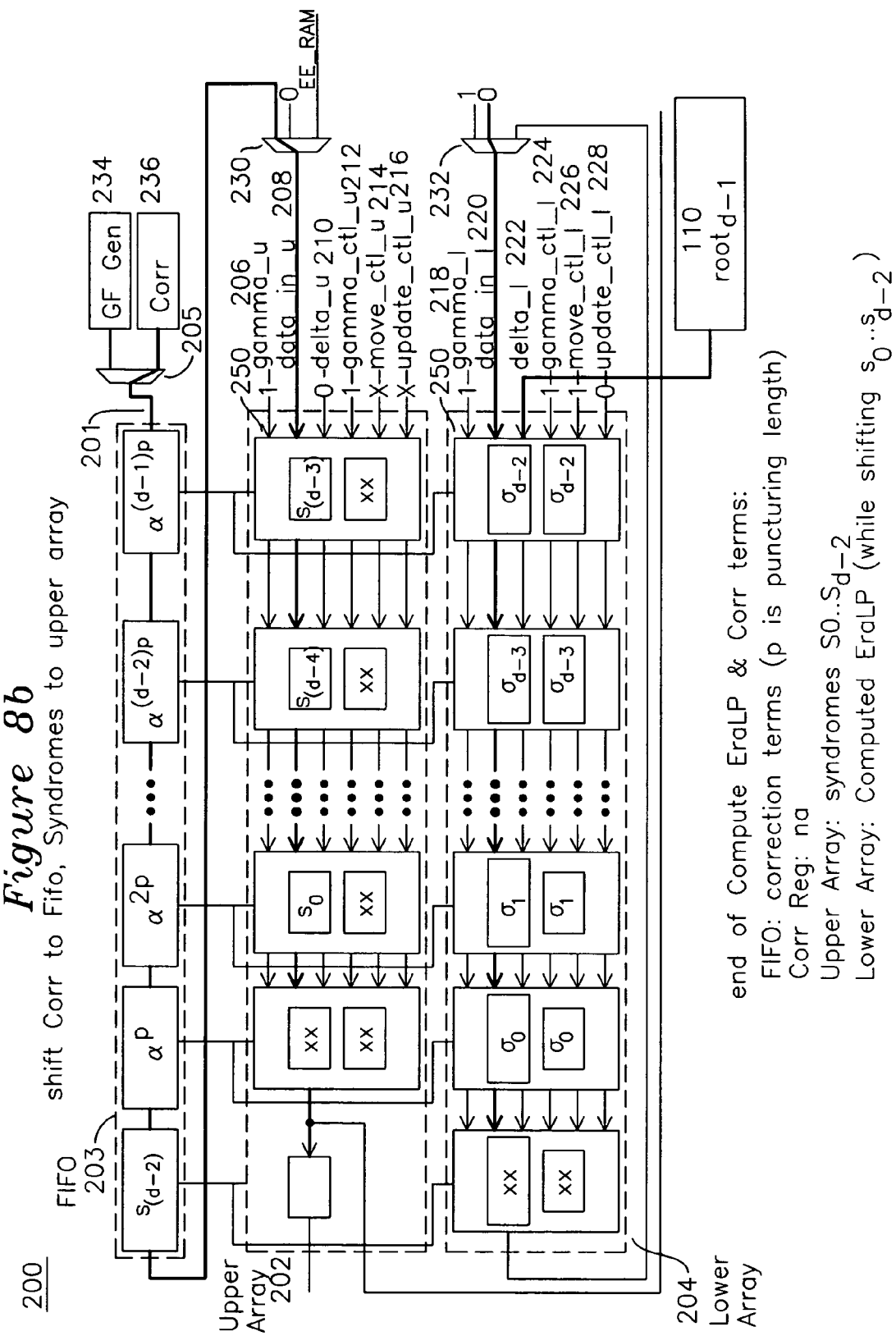
Figure 8C:
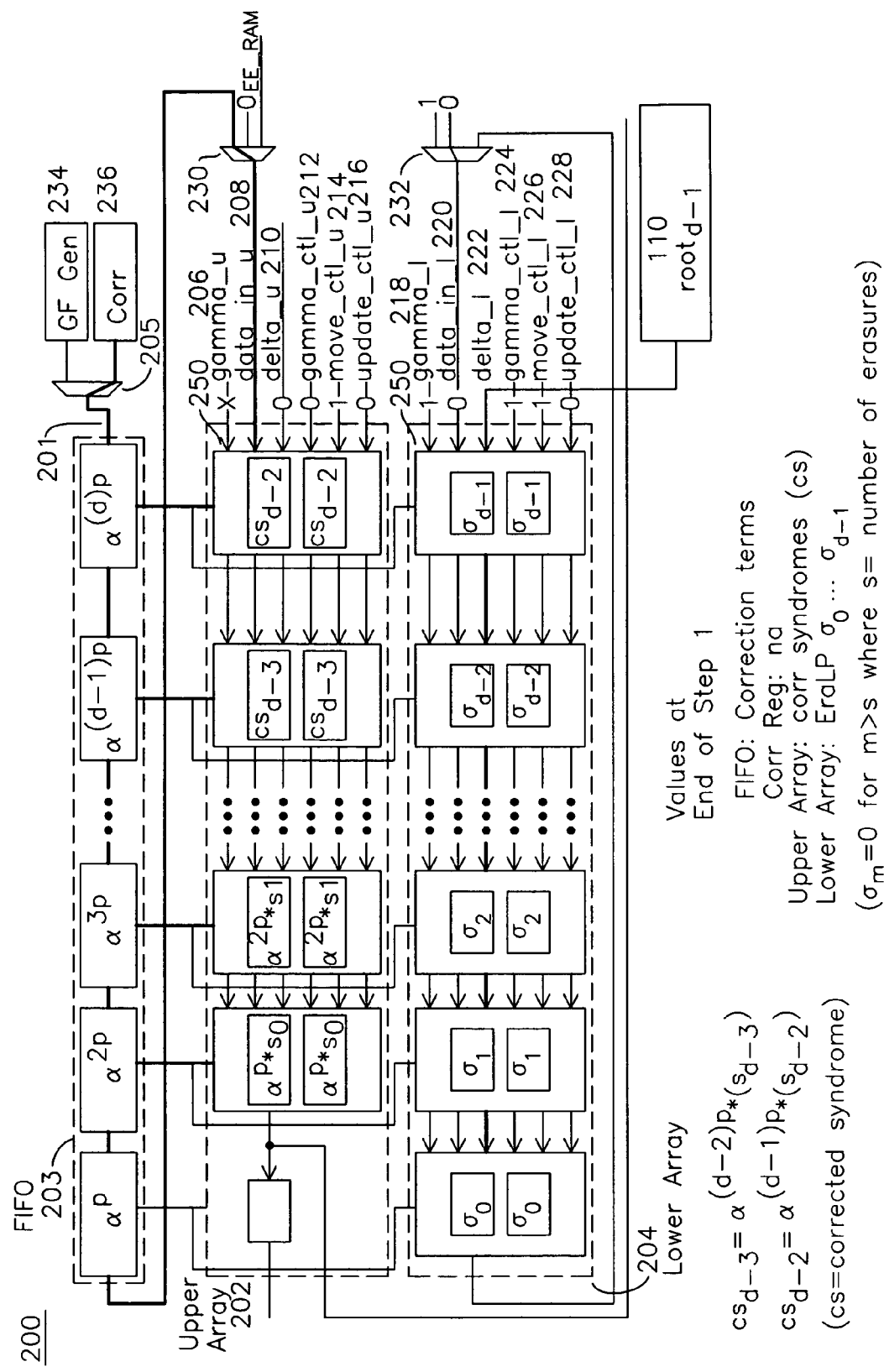

FIG. 8b shows the contents of upper and lower arrays d−1 clocks after loading syndromes into the FIFO 203. The FIFO 203 shifts the syndromes $s_0 \ldots s_{d-2}$ from the FIFO 203 through multiplexer 230 and to upper array 202 in d−1 clocks, while corrections terms $\alpha^p \ldots \alpha^{(d-1)p}$ are simultaneously shifted from correction register 236 to FIFO 203 via multiplexer 205. At the end of d−1 clocks, the terms, which are to be multiplied on the final step, are in adjacent registers: $\alpha^p$ and s0, $\alpha^{2p}$ and s1, etc. On the final dth clock, as shown in FIG. 8c, the adjacent terms are multiplied and stored in the upper array, while the syndromes are shifted one position in the FIFO 203. As shown in FIGS. 8c and 12b for the upper array, gamma_ctl 251 selects the corresponding FIFO input 231 of FIG. 6, and multiplier 246 multiplies the fifo data (correction term) with data_in (syndrome), which is also stored in F2 256 using the values for move_ctl_u=1 and update_ctl_u=0 shown in FIG. 12b.

As syndromes are shifted into the upper array, as shown in FIGS. 8a,b,c, the lower array is engaged in computing the EraLP (Erasure Locator Polynomial) using the erasure locations stacked in the previous pipeline stage. The lower array is initialized with a single '1' one clock before the first syndrome enters the upper array (see FIG. 8a). The configuration in which the lower array of FIG. 8b performs this operation is illustrated by a case of computing a third degree EraLP (having 3 erasures a, b and c) using a series of three REUs operating on a set of three values to compute the polynomial as shown in FIG. 9a through 9d. The term 'compute the polynomial' means the following:

$$(x-a)(x-b)(x-c)=x^3+(a+b+c)x^2+(ab+bc+ca)x+abc$$

The lower array 204 of FIG. 8b computes the RHS of the above equation as the values of a, b, c are being given as inputs to all the REUs 250 one at a time through the delta input as can be seen in FIGS. 9a through 9d, which show how this computation is carried on by the REU 250, illustrated for the simplified case where there are only 4 REUs, 300, 302, 304, and 306 in an array. In a similar manner, the Erasure Locator Polynomial (ELP) of FIG. 8b is computed by supplying the values of erasure locations, in places of a, b, c ... respectively. When no more erasures are present, a '0' is input, in place of the erasure locations. Hence it can be generalized that with 'd' REUs 250 in the lower array 204 at most 'd-1' erasures can be handled. Thus by the end of first 'd' clock cycles the upper 202 and lower 204 arrays of FIG. 8b hold corrected syndromes and erasure locator polynomial respectively.

Figure 8D:
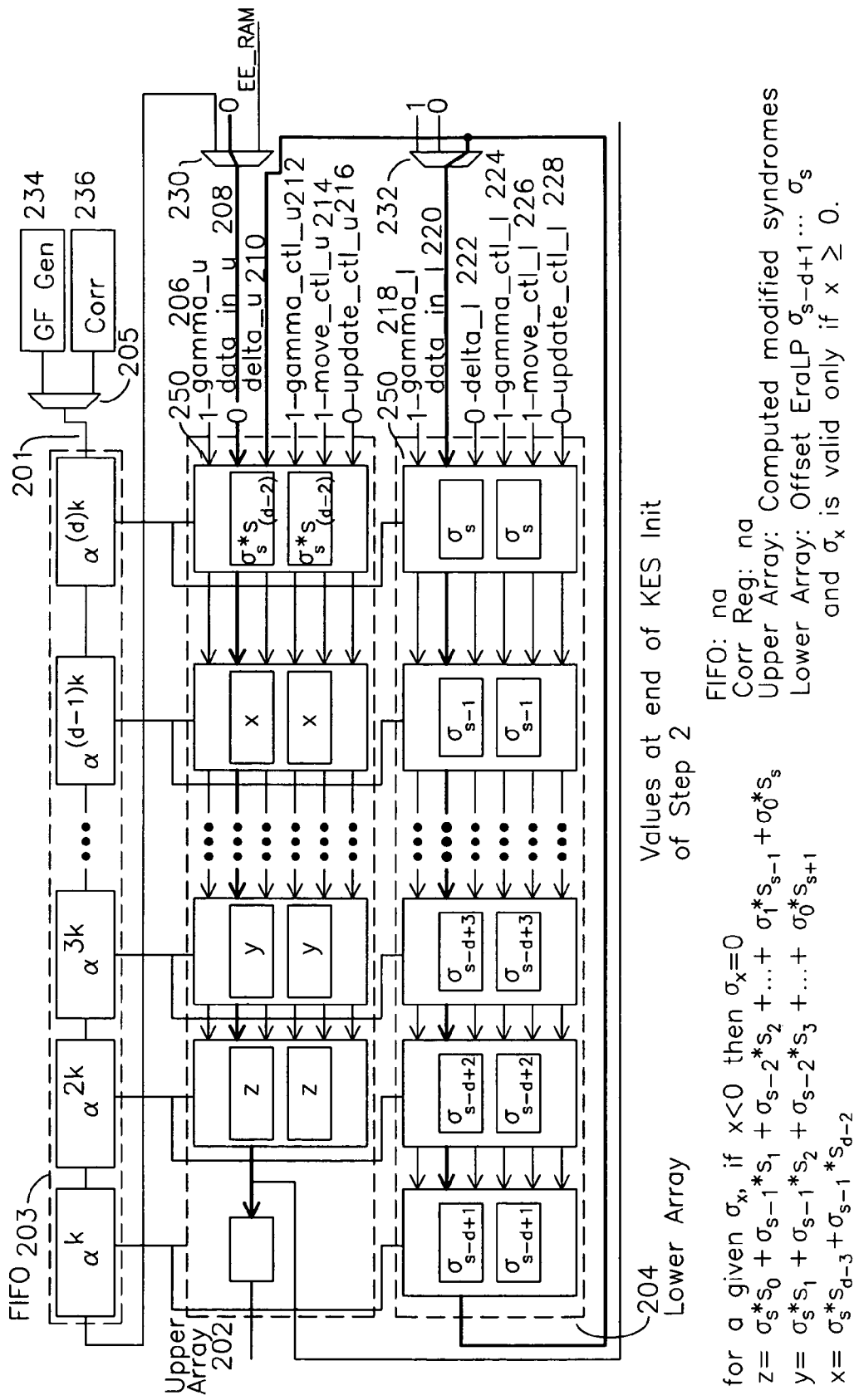
Figure 10A:
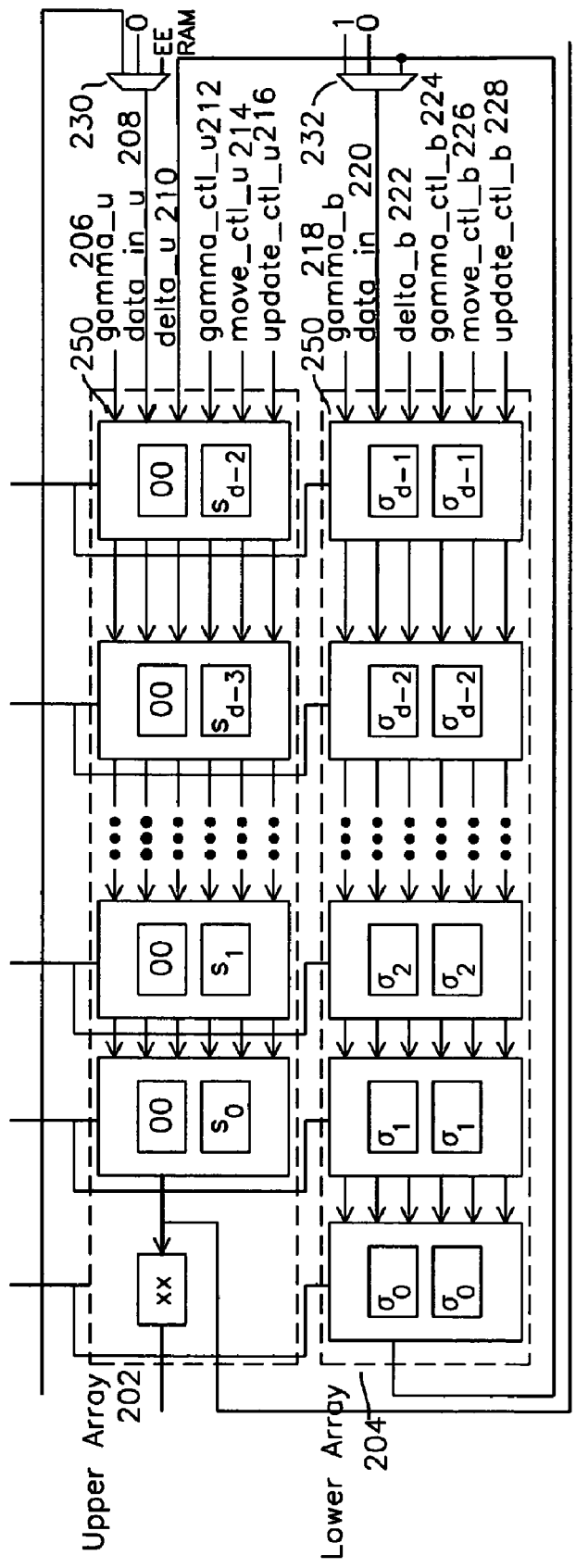
FIG. 10a through 10b show the configuration and computation details for the computation of the modified syndrome of FIG. 8d.
Figure 10B:
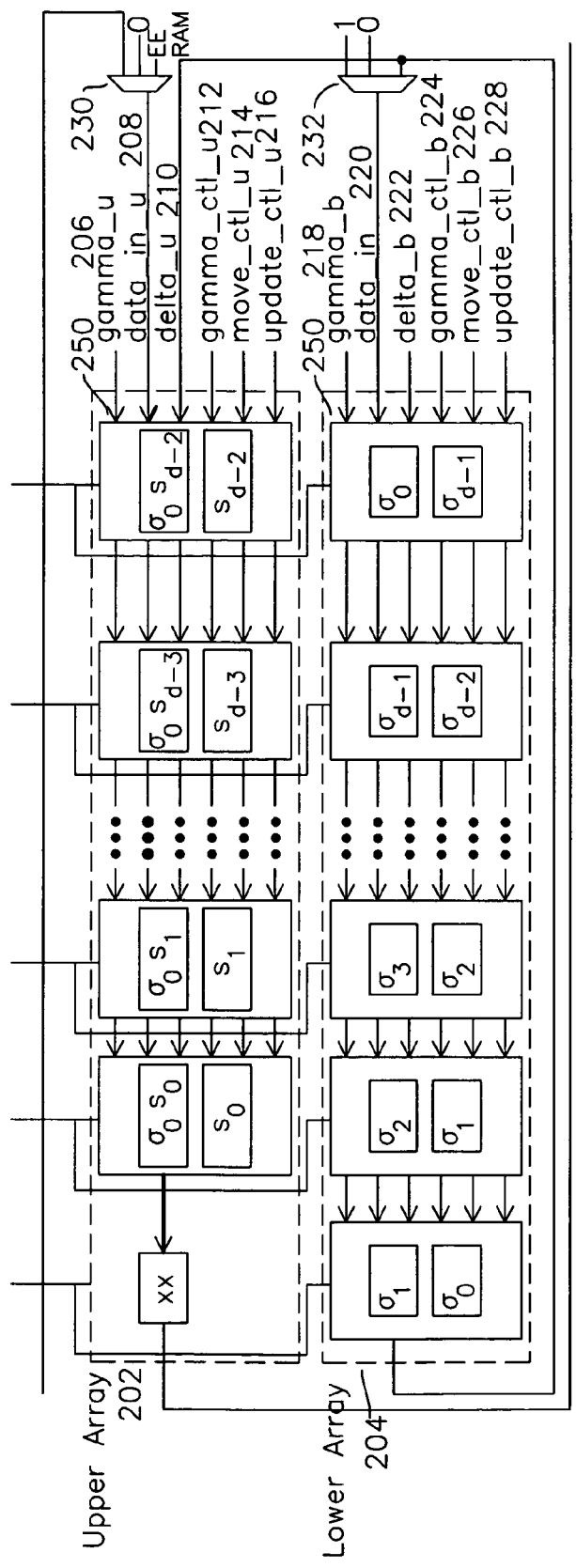
Figure 11A:
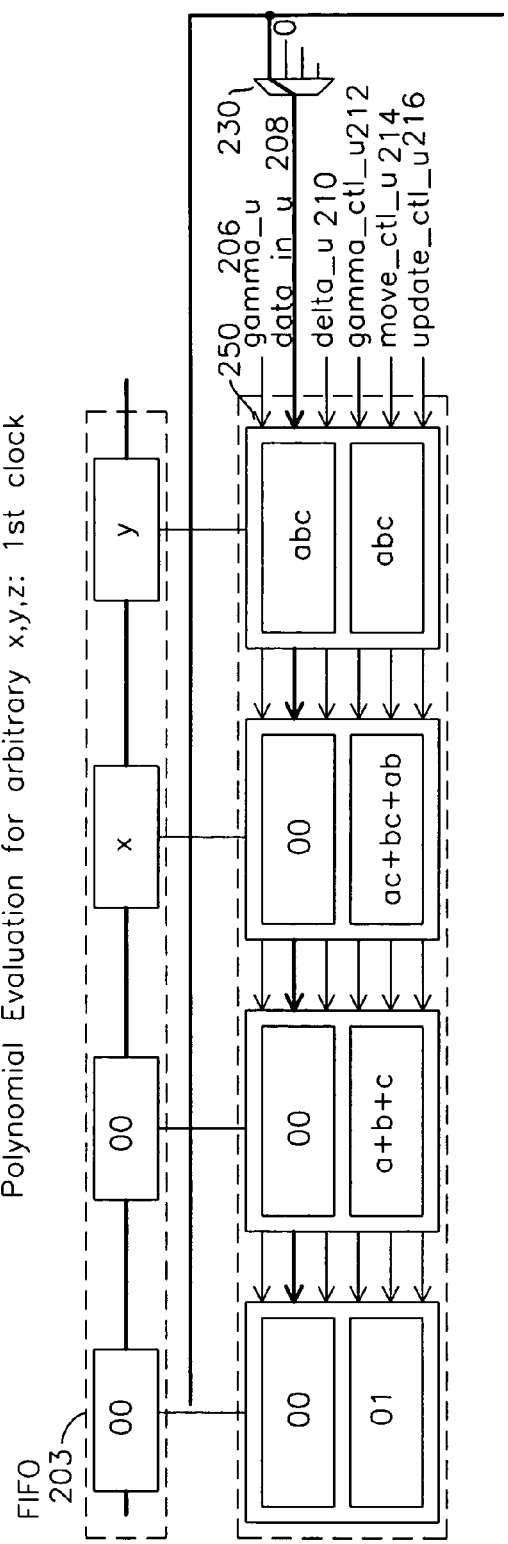
Figure 11B:
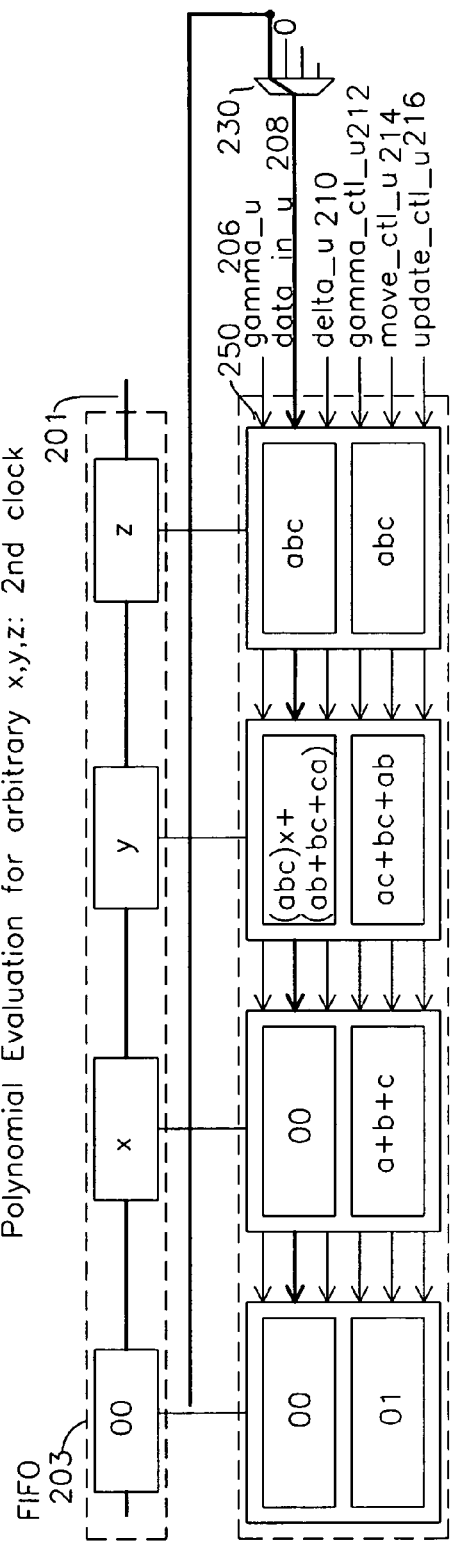

The second step shown in FIGS. 8d and 12b computes the modified syndromes in the upper array 202 and to offset the EraLP in the lower array 204. During this step, the upper array 202 is configured as a polynomial multiplier, and the lower array is configured as a simple shift register. The next 's+1' clocks are spent computing the modified syndromes in the upper array 202 and offsetting the EraLP in the lower array 204. The intermediate steps performed in FIG. 8d are shown in FIG. 10a, which shows the computation of the modified syndrome at the start of computation, FIG. 10b, which shows the intermediate result after a single clock cycle, and FIG. 8d, which shows the resultant values stored in the upper array and the lower array at the end of the computation.

Figure 8E:
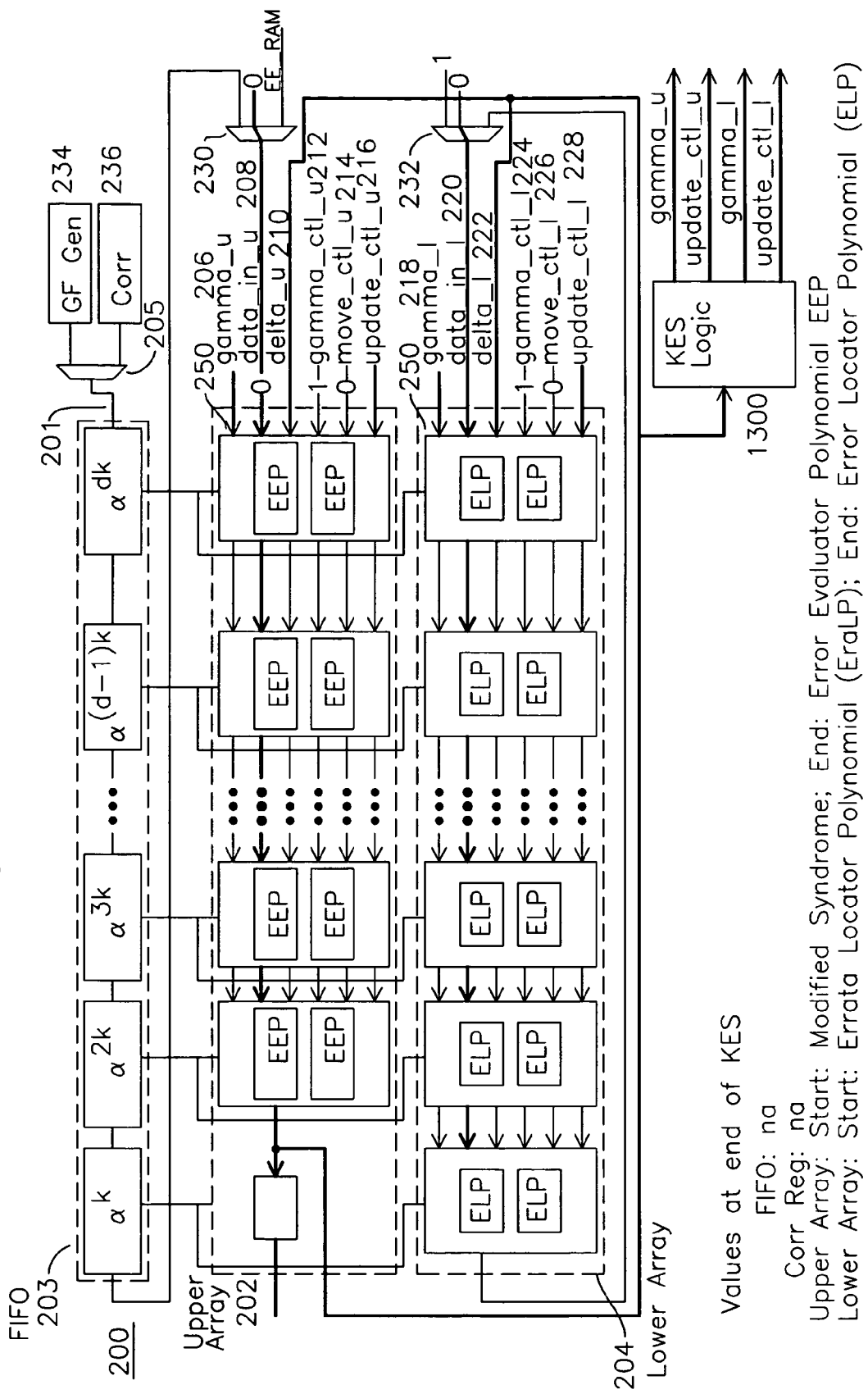
Figure 13:
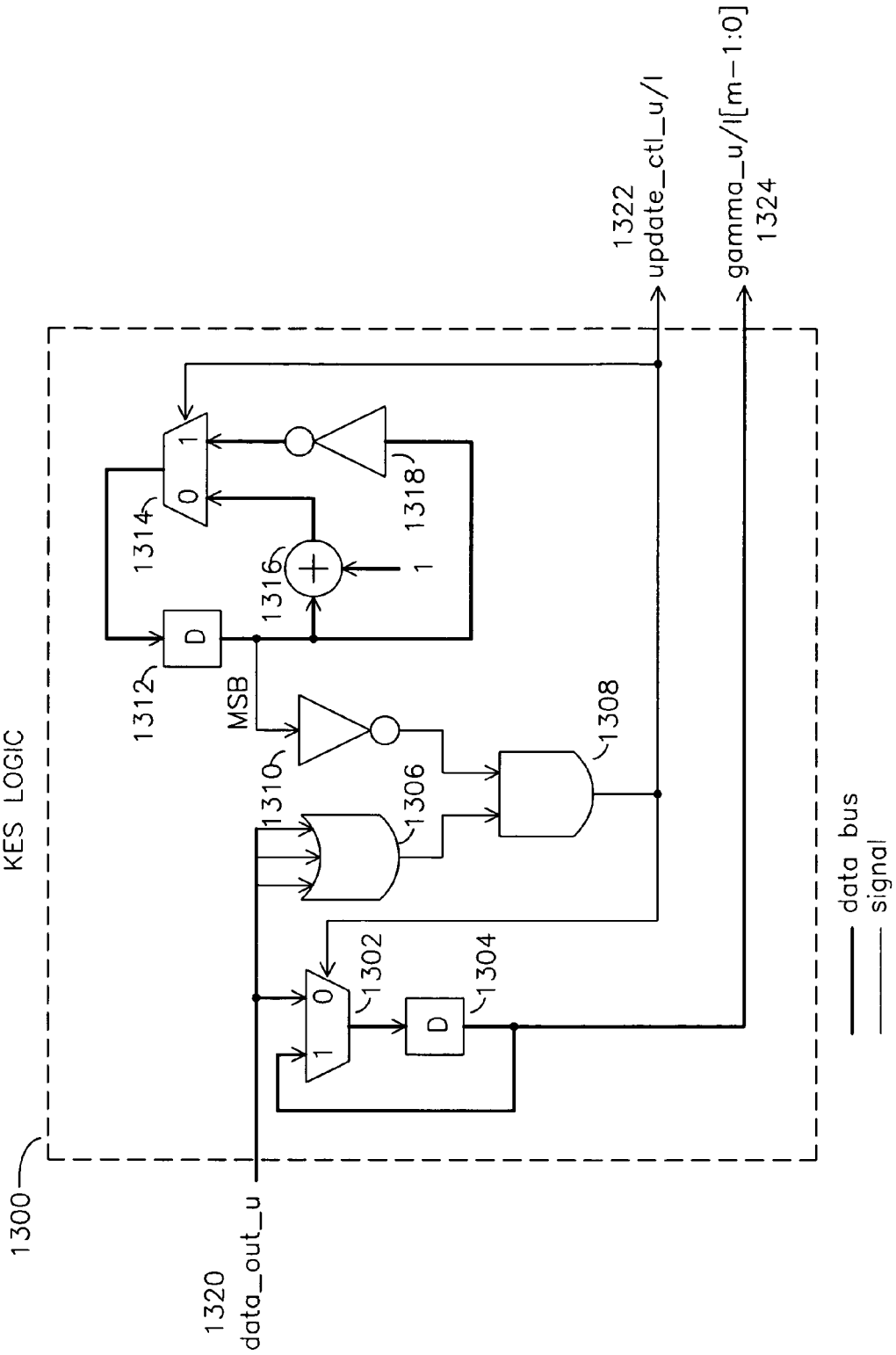
FIG. 13 shows a block diagram for the KES logic used in FIG. 8e.

FIG. 8d shows the RAP configured to solve the Key equation. The modified syndromes in the upper array and the erasure locator polynomial in the lower array are the initializations, for both the arrays so that the KES (Key Equation Solver) operation yields the Errata Evaluator Polynomial in the upper array and the Errata Locator Polynomial in the lower array. The KES operation is carried on for the next 'd-s-1' clocks so that by the end of this time, the upper array 204, which started with the modified syndrome and ended with the Error Evaluator Polynomial (EEP), and the lower array 204, which started with the EraLP and ended with the Errata Locator Polynomial (ELP) are left as shown in FIG. 8e. One example of the well-known KES logic 1300 of FIG. 8e is shown in FIG. 13, and includes multiplexers 1302 and 1314 controlled by gate 1308 which generates the update_ctl_u and update_ctl_l signals 1322 applied to the array as shown in FIG. 8e. Registers 1304 and 1312 store intermediate results, and inverters 1310 and 1318 negate the value of data fed to them. In this manner, the KES logic 1300 inputs a succession of data_out_u 1320 values and generates update_ctl_u and update_ctl_l 1322 and gamma_u and gamma_1 1324 applied to the upper and lower arrays of FIG. 8e. Sarwate et al also describe a KES implementation. The immediately prior MS-KES step initializes the arrays for KES. This is performed in the last clock of the MS computation, as shown in FIG. 12b. Similarly, the KES-ES step following the KES also initializes the arrays for the subsequent Error Search operation also known as the Root Search operation.

The polynomial evaluation is shown in FIG. 8f after d clocks. The upper array 202 evaluates the EEP while the lower array 204 evaluates the ELP. The GF generator 234 is used to generate the evaluation variables, that is, the inverses of the error locations. The evaluation is performed in a pipelined manner, i.e. as the GF elements shift through the FIFO the polynomials are evaluated. The detailed operation of polynomial evaluation can be seen in the FIGS. 11a through 11d. The roots of the ELP are the inverse error locations, so the value of the evaluated polynomial from the upper array is written to memory stack if a zero is detected as the output of the lower array, else a zero is written in to the memory stack. After k+d clocks, all of the polynomial values generated by GF generator 234 have been shifted through the FIFO for comparison with each of the EEP values in the upper array 202 and ELP values in the lower array 204. In this manner, the roots of the ELP are found.

Figure 8G:
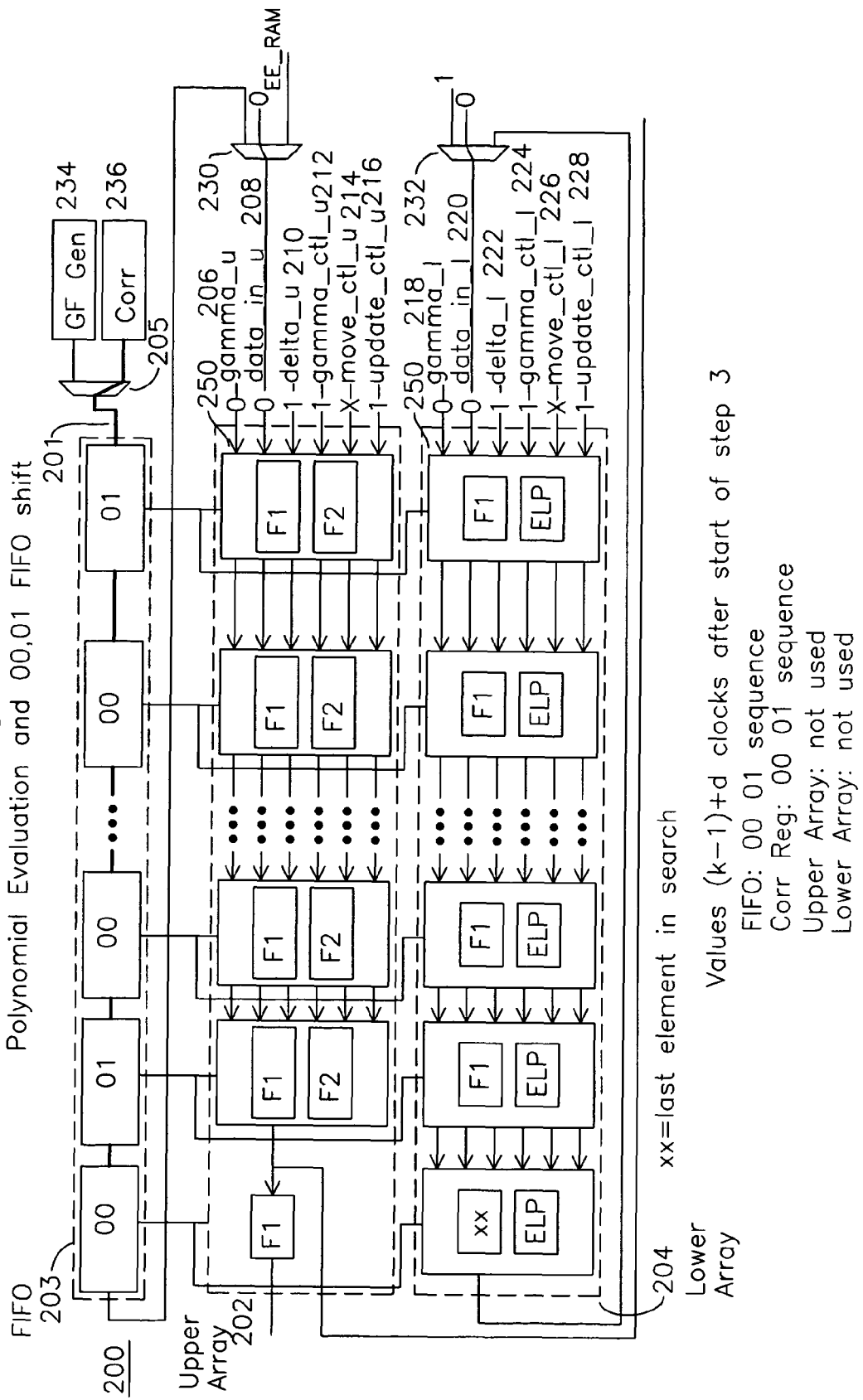

FIG. 8g shows initialization of the FIFO with the 00 01 sequence in d clock cycles, where the sequence is shown being generated by the correction register 236, but could be generated using an alternate mode of the GF generator, or any initialization method including executing these d clocks during the last d- clocks of the Root search.

Figure 8H:
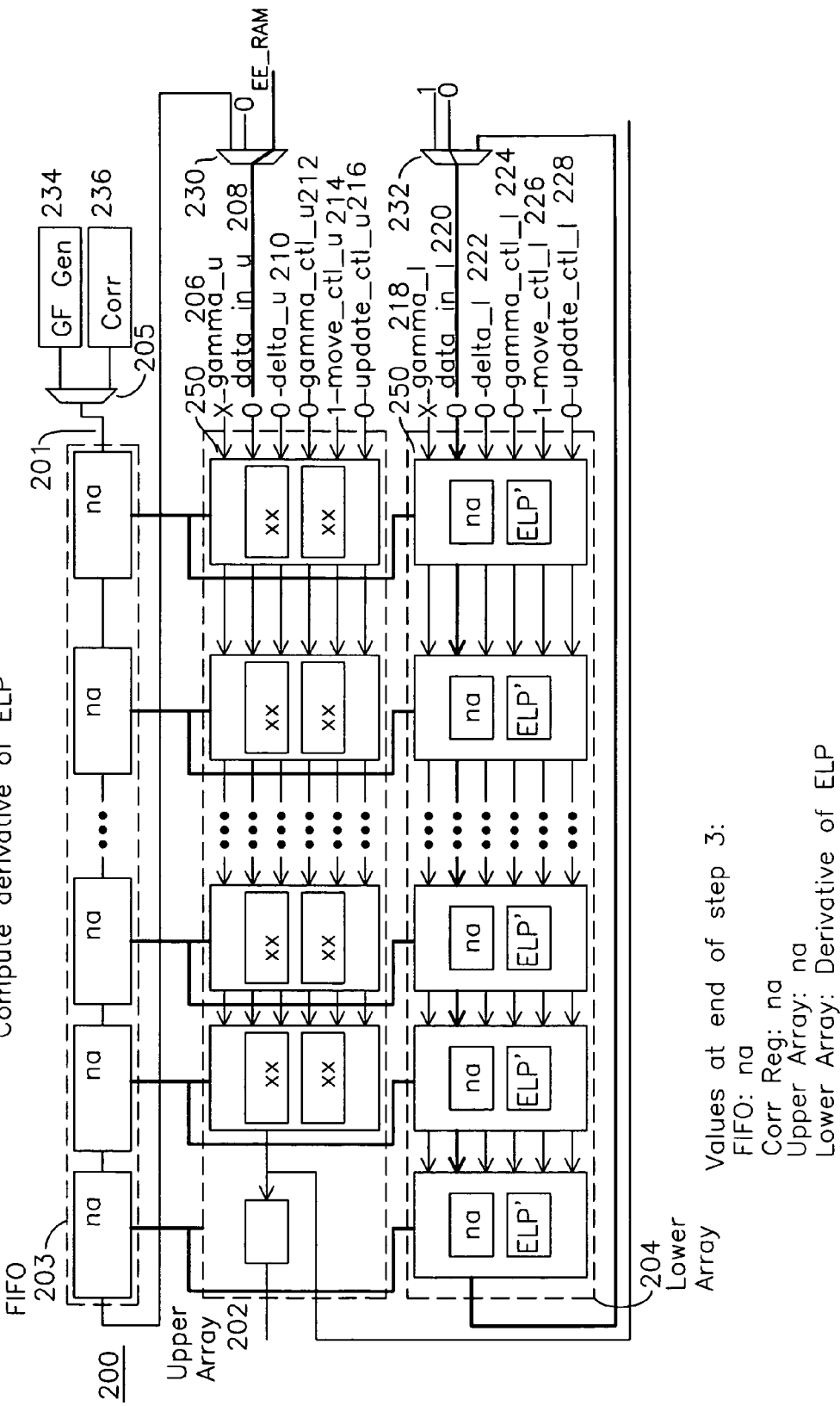

FIG. 8h shows computing the derivative of the ELP in the lower array (LA), which takes 2 clock cycles. The first evaluated value of the ELP appears at the output of the Lower Array d clocks after this process begins, as shown in FIG. 12b/c. Consequently, for a search over k values of the evaluation variable, the last (kth) evaluated value of the ELP would appear at the output of the LA after (k−1)+d cycles. In this final cycle, the FIFO contents and the control signals can be arranged to initiate the derivative computation process. Therefore, 1 clock cycle of the two-stage derivative computation process is effectively hidden inside the Root Search Process. Therefore, the next cycle is enough to compute the derivative of ELP, as illustrated in FIG. 12c.

Figure 8I:
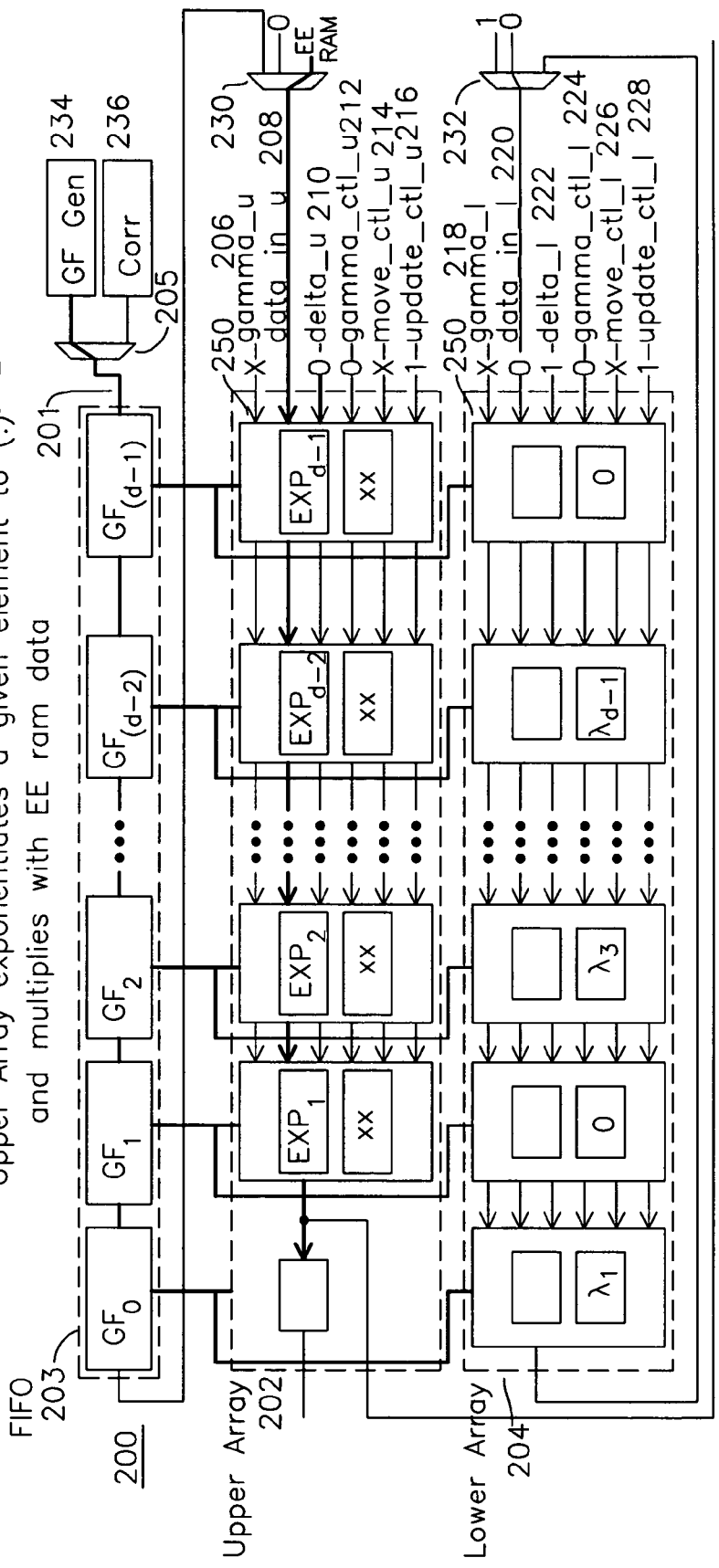
Figure 9A:
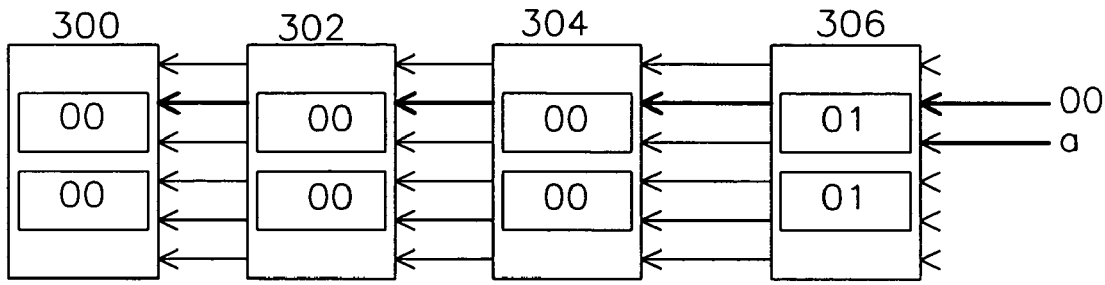
FIGS. 9a through 9d show the configuration and computation details for the polynomial computation of FIG. 8b.
Figure 9B:
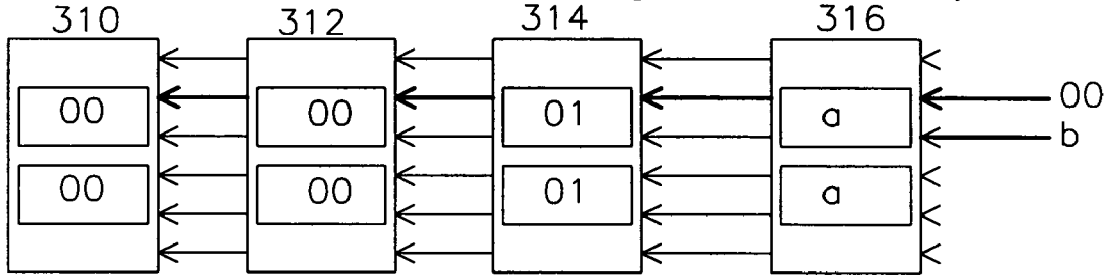
Figure 9C:
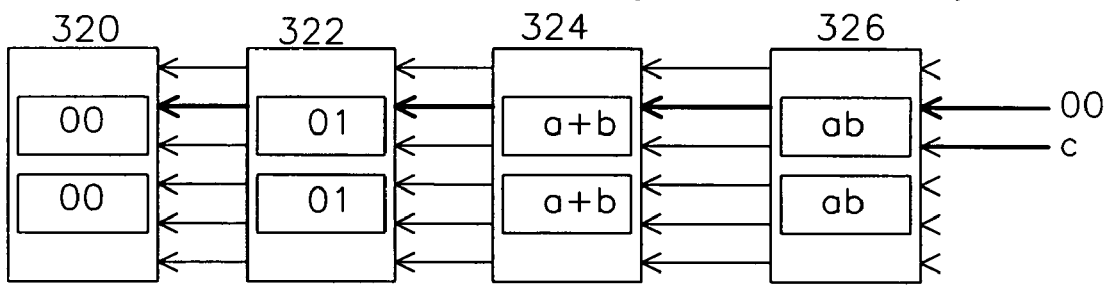
Figure 9D:
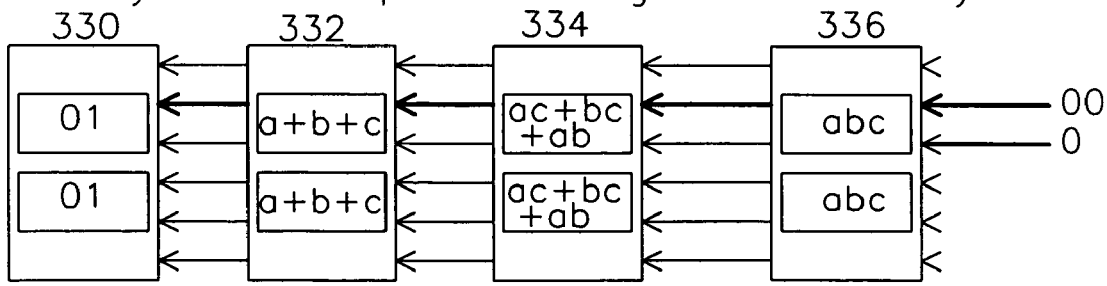

As shown in FIG. 8i, the upper array 202 is used for GF exponentiation, where the REU 250 is configured as shown on FIG. 6, and the lower array 204 is used for polynomial evaluation. The FIFO 203 again receives the same set of GF elements used for error location search, and evaluates the derivative of the ELP in the lower array and the correction term for the evaluated values of EEP in the upper array using k+d clock cycles. This is done in FIG. 8i by coupling the GF generator 234 through multiplexer 205 to FIFO 203. The FIFO 203 is directly coupled to each REU 250 of the lower array 204 using the highlighted vertical bus shown. Simultaneously, each element 250 of the upper array 202 is configured as an exponentiator, as shown in FIG. 8i FIG. 12 shows the utilization of all of the previously computed values, which are provided via data interface 504 from the upper array and 506 from the lower array. The Error Value Function 211 has two operating modes, as shown in the table of FIG. 12a, which also shows the contents at each of the stages of FIG. 12. The upper array 202 output EEP values 504 are multiplied 522 with the inverse 520 of the output of the data 506 from lower array 204. The inversion operation is performed by the inverter 520 and the multiplication is performed by the multiplier 522. This step implements the Forney's formula to computes error magnitudes, which are now added 514 to the received word 512, to negate the channel error, finally generating corrected codeword output 508.

As described above, the reconfigurable arithmetic processor can perform a total of 8 processes which are referred to as steps in FIGS. 12b/c:

| Function | Number of clock cycles |
| --- | --- |
| Steps 1 & 2: Syndrome correction in the case of punctured and shortened codes and computation of the EraLP | d |
| Step 3: Modification of the syndromes to for the errors-and-erasures KES operation | s + 1 |
| Step 4: KES operation | d − 1 − s |
| Step 5: Polynomial evaluation during root search | k + d |
| Step 6: Shifting in of a 1(multiplicative identity of the finite field) and a 0 (additive identity of the finite field) for differentiating the ELP. | d (This duration is concurrent with the previous operation) |
| Step 7: Polynomial differentiation | 2 |
| Step 8: Finite field exponentiation and error evaluation | k + d |

It is important to note that suitable schedules can be used to hide the processing times of some of the steps, as was described earlier regarding derivative computation). Therefore, the decoding process will occupy a total of $N_{dec}=4d+2k+1$ clock cycles. Since RS codes satisfy $d=n-k+1$, the number of clock cycles can be greater than n.

For high throughput byte-serial decoders, a codeword can be expected to arrive every n clocks. To maintain throughput without hardware replication, it is important to reduce the computation load on the processor by assigning some of its tasks to a new unit that operates on the data output by the processor. The decoder now consists of the syndrome computing unit, the processor, and this new unit as a three-stage pipeline.

After the KES operation is complete, the error location polynomial is output serially from the lower array into a RAM 502 shown in FIG. 12 (for use by the later error locator unit) while the error evaluation polynomial from the upper array is modified and fed into the lower array. This modification essentially "weights" each polynomial coefficient according to the "offset" from which the error evaluation polynomial is computed. To illustrate this concept, an example is useful: Suppose a polynomial $\Omega(x)$, given by $$\Omega(x)=\omega_0+\omega_1 x+\ldots+\omega_{d-2}x^{d-2}$$

is to be evaluated, at two values $x=\alpha^{k_1}$ and $x=\alpha^{k_1+1}$ for some $l \neq 0$.

$$\Omega(\alpha^{k_1+l}) = \omega_0 + \omega_1 \alpha^{k_1} + \ldots + \omega_{d-2}\alpha^{k_1 \cdot d-2}$$

$$\Omega(\alpha^{(k_1+l)}) = \omega_0 + \omega_1 \alpha^{k_1+l} + \ldots + \omega_{d-2}\alpha^{(k_1+l)d-2}$$

The above expressions can also be written as $$\Omega(\alpha^{(k_1+l)}) = \omega_0 + (\omega_1 \alpha^l)\alpha^{k_1} + \ldots + \left(\omega_{d-2}(\alpha^l)^{d-2}\right)\alpha^{k_1 \cdot d-2}$$

which can be also expressed as $$\tilde{\Omega}(\alpha^{k_1})=\tilde{\omega}_0+\tilde{\omega}_1\alpha^{k_1}+\ldots+\tilde{\omega}_{d-2}(\alpha^{k_1})^{d-2}$$

with $\tilde{\omega}_m=(\alpha^l)^m\omega_m$ for m=0, 1, . . . , d−2.

The architecture described in this invention has a regular structure, because its main constituent, the RAP, is systolic. As compared to prior art, this architecture exploits the inherent similarity of arithmetic operations involved in all stages of Reed-Solomon decoding. This results in a single versatile arithmetic processor that can perform all the decoding operations.

Moreover, we have shown that with minimal hardware overhead, the throughput can be improved by offloading and re-ordering certain key processing steps.

Furthermore, interleaved data streams can also be decoded with some simple design changes that can profitably use the interleaving property in all stages of decoding to increase operating frequency, and hence the speed of the decoder.

Appendix

Mathematical Derivations

The equations pertain to the conventions and upper and lower array variable labels shown in the FIG. 6. FIG. 1: block diagram indicating the $1^{th}$ REU for the equations shown below Mathematical Derivation of RS decoding steps:

$$A(x)=a_0+a_1x+a_2x^2+\ldots+a_{d-2}x^{d-2}$$

$$B(x)=b_0+b_1x+b_2x^2+\ldots+b_{d-2}x^{d-2}$$

$$F(x)=f_0+f_1x+f_2x^2+\ldots+f_{d-2}x^{d-1}$$

$$G(x)=g_0+g_1x+g_2x^2+\ldots+g_{d-2}x^{d-1}$$

At some coefficient position "1" and at time "r"

$$a_l(r+1)=a_{l+1}(r)\cdot\alpha_1(r)+b_1(r)\cdot\beta(r)$$

and $$b_l(r+1) = \begin{cases} a_l(r+1) & \text{if } c_{b_1}=1 \text{ and } c_{b_2}=0 \\ a_{l+1}(r) & \text{if } c_{b_1}=0 \text{ and } c_{b_2}=0 \\ b_l(r) & \text{if } c_{b_2}=1 \end{cases}$$

The FIFO is such that if at time r, in locations 0, 1, 2, . . . d−1, the contents are $$m_0(r),m_1(r),m_2(r),\ldots m_{d-1}(r)$$

and at that instant $$m_{out}(r)=m_0(r)$$

then $$m_k(r+1)=m_{k+1}(r) \text{ and } m_{d-1}(r+1)=m_{in}(r)$$

During the SB operation (for the first d−3 clocks) for both the arrays $$\alpha_1(r)=1 \text{ and } \beta(r)=0 \ (c_a=1) \ c_a=0 \Rightarrow \alpha_m(r)=m_l(r)$$

$$a_1(r+1)=a_{l+1}(r) \text{ and}$$

$$b_l(r+1)=a_{l+1}(r)$$

at the same time in the lower array, the erasure locator polynomial is computed, from its roots:

$$f_l(r+1)=f_{l+1}(r)\cdot\phi_1(r)+g_l(r)\cdot\psi(r)$$

and $$g_l(r+1) = \begin{cases} f_l(r+1) & \text{if } c_{b_1}=1, c_{b_2}=0 \\ f_{l+1}(r) & \text{if } c_{b_1}=0, c_{b_2}=0 \\ b_l(r) & \text{if } c_{b_2}=1 \end{cases}$$

The modified syndromes are evaluated in the upper array and the lower array offsets the EraLP in the lower array:

$$a_l(r+1)=a_{l+1}(r)\cdot\alpha_l(r)+b_l(r)\cdot\beta(r)$$

and $$b_l(r+1) = \begin{cases} a_l(r+1) & \text{if } c_{b_1}=1, c_{b_2}=0 \\ a_{l+1}(r) & \text{if } c_{b_1}=0, c_{b_2}=0 \\ b_l(r) & \text{if } c_{b_2}=1 \end{cases}$$

where $\alpha_l(r)=1$ and $\beta(r)=0$ so that $a_l(r+1)=a_{l+1}(r)$ and $b_l(r+1)=a_{l+1}(r)$ Update cycle:

$\alpha_l(r)=m_l(r)$ and so $a_l(r+1)=a_{l+1}(r)\cdot m_l(r)$ and $b_l(r+1)=b_{l+1}(r)\cdot m_l(r)$ and at the same time the lower array: first (s+1) cycles of the above (d−2) cycles $$f_l(r+1)=f_{l+1}(r)\cdot\phi_l(r)+g_l(r)\cdot\psi(r)$$

$$g_l(r+1) = \begin{cases} f_l(r+1) & \text{if } c_{b_1}=1, c_{b_2}=0 \\ f_{l+1}(r) & \text{if } c_{b_1}=0, c_{b_2}=0 \\ g_l(r) & \text{if } c_{b_2}=1 \end{cases}$$

and since $\phi_l(r)=1$ and $\psi_l(r)=<\text{root of EraLP}>$ for all $l \leq s$ $f_l(r+1)=f_{l+1}(r)+g_l(r)\cdot\psi(r)$ and $g_l(r+1)=f_{l+1}(r+1)$ and the last (d−s−1) cycles $\phi_l(r)=1$ and $\psi_l(r)=0$ and so $f_l(r+1)=f_{l+1}(r)$ and $g_l(r+1)=f_{l+1}(r)$ Modified Syndromes: for next 's+1' cycles For first 's' cycles $a_l(r+1)=a_{l+1}(r)+b_l(r)\cdot\beta(r)$ and $b_l(r+1)=a_{l+1}(r)$ Where $\beta(r)=f_r$ In the 's+1'$^{th}$ cycle initialization for modified syndromes $a_l=b_l l=0,1,\ldots,d-2$ $f_l=g_l l=0,1,\ldots,d-2$ KES operation:

The operation lasts for 'd−1−s' cycles. This step can be interpreted as finding the complete errata location polynomial, starting with some prior knowledge of the location of errors (every erasure location is presumed to be in error). The update equations are from the inversionless Berlekamp-Massey algorithm with errors and erasures. Two distinct computation steps define this mode:

1. 'a' and 'f' polynomial update:

$a_l(r+1)=a_{l+1}(r)\cdot\alpha(r)-a_0(r)\cdot b_l(r)$ $f_l(r+1)=f_{l+1}(r)\cdot\alpha(r)-a_0(r)\cdot g_l(r)$ The value $\alpha(r)$ is broadcast to all the $\alpha_l(r)$ inputs of the cell array. Note that the value $a_0(r)$ is the discrepancy for the 'r'th cycle of KES operation. This is connected to $\beta_l$ input of all REU cells.

The control signal $c_a=1$.

2. Other updates: An auxiliary register 'c' is used in the algorithm, as follows:

If $a_0(r) \neq 0$ and $c(r) \geq 0$ $b_l(r+1)=a_{l+1}(r)$ $g_l(r+1)=f_{l+1}(r)$ $\alpha(r+1)=a_0(r)$ $c(r+1)=-c(r)-1$ (the control signals are $c_{b_1}=0, c_{b_2}=0$) else $b_l(r+1)=b_l(r)$ $g_l(r+1)=g_l(r)$ $\alpha(r+1)=\alpha(r)$ $c(r+1)=c(r)+1$ (the control signals are $c_{b_1}=0, c_{b_2}=1$) The steps 1 and 2 are performed once every cycle, for 'd−1−s' cycles.

After a root such as the Chein search, one array (upper array) evaluates the EEP and the other (lower array) evaluates the ELP. The steps describing the same are given below:

1) During polynomial evaluation with the a particular exponent of {alpha}, which is shifted through the FIFO, For the FIFO $m_{in}(r+1)=p(r+1)$ where p(r+1) is from the GF generator, where $$p_r = \frac{p(r)}{gen(r)},$$

gen(r) is the Field generation polynomial and $p(0)=\alpha^{sh}$, where $\alpha^{sh}$ corresponds to the primitive field element raised to the shortening lengths' exponent.

And further $$m_l(r+1) = m_{l+1}(r)$$

2) For both the arrays we set $c_a=0$, $c_{b_1}=X$ and $c_{b_1}=1$ so that
For the upper array:

$$a_l(r+1) = a_{l+1}(r) \cdot \alpha(r) + b_l(r)$$

and
For the lower array:

$$f_l(r+1) = f_{l+1}(r) \cdot \phi(r) + g_l(r)$$

and $$g_l(r+1) = g_l(r)$$

3) The next stage is that of finding the derivative of the ELP in the lower array and finding the $(d-1)^{th}$ exponent of a GF element in the upper array.

4) The FIFO is given the same sequence of data as was given in the root search stage. The input to the upper array is $d_{U\_in}(r) = \Omega^h(r)$ and thus $\Omega^h(r)$ for all values of 'r' are the evaluated values of $\Omega^h(x)$ in the previous stage.

The equations illustrating the functionality of the upper array are below:
The control signals for the upper array are $$\alpha_j = m_j, \beta = 0, c_a = 0, c_{b_2} = 1 \text{ and } c_{b_1} = 0$$

$$a_l(r+1) = a_{j+1}(r) \cdot \alpha(r)$$

and $$b_l(r+1) = b_l(r)$$

the lower array simultaneously evaluates the derivative of the ELP, the computational steps are illustrated as equations as shown below:
The control signals for the lower array are $$\phi_j = m_j, \psi = 1, c_a = 1, c_{b_2} = 1 \text{ and } c_{b_1} = 0$$

$$f_l(r+1) = f_{j+1}(r) \cdot \phi(r) + g_l(r)$$

and $$g_l(r+1) = g_l(r)$$

This completes all the computational steps in decoding a codeword, in the decoder. The data is generated as follows:

This completes all the computational steps in decoding a codeword, in the decoder. The corrected data is generated by adding the calculated error magnitudes to the corresponding symbol location.

Definitions, Terms, Elements:

Bit: A fundamental unit to represent digital information. It is either a '0' or '1'.

Symbol: One or more bits used to denote information is called a symbol.

Data Source: A source of information that outputs a sequence of symbols is called a data source.

Word: A sequence of certain number of symbols is called a word.

Data word: A data word is a sequence of a given number of symbols produced by a data source.

Error: The transformation of one symbol to another by the communication channel is called an error.

Error Correction: The process of correcting errors produced by a communication channel. Forward error correction implies the ability to correct certain number of errors without request for retransmission of data. Introducing a certain number of redundant symbols into the transmitted data stream does this.

Codeword: The concept of error correction using redundancy implies the concept of validity of transmitted symbol sequences. A valid symbol sequence (Which includes the data symbols and the redundant symbols) is called a codeword.

Code: The set of all possible codewords defined over a symbol set is called a code.

Encoding: The process of generating a codeword from a data word. The apparatus for doing the same is called an Encoder.

Decoding: The process of estimation of the data word from a received (possibly error-prone) word is decoding. The apparatus doing the same is called Decoder.

Linear code: A code in which the sum of two codewords produces another codeword. The definition of sum operation will be described later.

Block Code: A code whose constituent codewords are all 'blocks' of symbols is called a block code. The number of symbols in every codeword is denoted by 'n'. The number of data symbols that are encoded is denoted by 'k'.

Linear Block Code: A block code that is linear and whose constituent codewords are all blocks is called linear block code.

Systematic Code: A code in which the symbols of the data word and the redundant symbols are distinguishable is called a systematic code. All systematic codewords can be represented as the concatenation of the data word and the redundant symbols.

Linear Systematic Block Code: An error correcting code that satisfies all the above definitions 13, 14, 15, 16 is called a linear systematic block code.

Minimum distance: The minimum number of symbols to be modified in order to convert one valid codeword into another.

Field: A set of symbols on which the basic arithmetic operations of '+', '−', 'x', and '/' are defined is called a field.

Reed-Solomon code: A (n,k,t) Reed-Solomon code over $GF(2^m)$ is an error correcting code with k, m-bit data symbols, which are encoded to n, m-bit wide codeword symbols. Without puncturing, shortening $n=2^m-1$ and 't' is the maximum correctable errors. The minimum distance of the code is $d=2 \cdot t+1$. Then $k=n-(d-1)$. The set of all possible symbol strings is called the codeword set.

Frame: A stream of data words (m-bit each), which form a codeword. In the present context, the constituent data words are assumed to arrive at the decoder in order.

Shortening: Of the k-data symbols certain pre-defined number of symbols are made to zero, and later the data is encoded. These zeros are never transmitted. This way greater code rates can be achieved.

Code rate: Code rate is a ratio indicating the redundancy added to the information. Code rate is obtained by taking the ratio of the number of data symbols to the codeword symbols.

Puncturing: Puncturing is the operation of deleting the parity symbols after encoding. While decoding the code, these locations are treated as erasures, though undeclared by the demodulator. This improves the code rate at the expense of error correcting capability of the code.

Error Locator Polynomial: The polynomial whose coefficients belong to $GF(2^m)$, and whose roots are the inverse error locations is called the error locator polynomial Erasures: Tentative guesses of the demodulator, depending on the channel conditions are called erasures.

Erasure Locator Polynomial: The polynomial whose roots are the inverse erasure locations is called the erasure locator polynomial. In the present context, punctured locations are treated as erasures.

Syndromes: The evaluated values of the input codeword for the zeros of the generator polynomial are called syndromes. The codewords when encoded are made such that the zeros of the generator polynomial are also zeros of the codeword.

Critical Path: The longest combinatorial path in a digital design.

Critical Path Delay (CPD): The delay a signal suffers in traversing the critical path of a circuit.

PIPELINE RAM: The decoder is a pipelined one and hence the codeword which was received in the previous frame, is stored in a RAM, which we address as PIPELINE RAM.

Exponentiator: A circuit that can compute higher powers of any desired field element.

Formal Derivative: If $A(x)=a_0+a_1x+a_2x^2+\ldots+a_nx^n$ is a polynomial where all $a_i, 0 \leq i \leq n$ are elements of $GF(2^m)$ then the formal derivative of $A(x)$ is defined as $A'(x)=a_1+a_3x^2+a_5x^4+\ldots$ as the coefficients are all in $GF(2^m)$.

We claim:

1. An error correction elementary unit for use with a clock, said elementary unit having:
   a FIFO data input;
   a gamma input;
   a delta input;
   a gamma control input;
   a data input;
   a move control input;
   an update control input;
   an F1 register which generates an output by storing an input upon said clock;
   an F2 register which generates an output by storing an input upon said clock;
   a first multiplexer having an output selected by said gamma control, said output being said gamma input when said gamma control input asserted, and said FIFO data input at other times;
   a first Galois field multiplier generating the product of said first multiplexer output and said data input;
   a second Galois field multiplier generating as output the product of said delta input and said F2 output;
   a first Galois field adder having an output derived from the sum of said first multiplier output and said second multiplier, said first adder output coupled to said F1 input;
   a second multiplexer controlled by said move control input, said second multiplexer output being said first Galois field adder output when said move control input is asserted, and said data input at other times;
   a third multiplexer controlled by said update control input, said third multiplexer having an output coupled to said F2 input, said multiplexer selecting said F2 output when said update control input is asserted, and said second multiplexer output at other times.

2. The processor of claim 1 where during an EraLP II computation step, said gamma control input is asserted, said gamma input is 1, said delta input is root locations, and said data input is 0.

3. The processor of claim 1 where during a single clock shift step, said gamma control input is asserted, said gamma input is 1, and said delta input is 0.

4. The processor of claim 1 where said multiplier is a GF(16) multiplier.

5. The processor of claim 1 where during a Corrected Syndrome computation step, said gamma control input is not asserted, said move control is asserted, said update control is not asserted, said data input is a syndrome term, and said FIFO input is a correction term.

6. The processor of claim 1 where during a KES computation step, said gamma control input is sequentially computed according to a KES computation, said move control is not asserted, and said update control is not asserted, and said KES computation generates said gamma input and said update-_control input.

7. The processor of claim 1 where during an Errata Locator Polynomial (EraLP) to Error Locator Polynomial computation step, said gamma control input is asserted, said gamma is 1, said move control is asserted, said update control is not asserted, said data input is a corrected syndrome, and said delta input is 0.

8. The processor of claim 1 where during a Polynomial Evaluation step, said data input is 0, said gamma control input is not asserted, said delta input is 1, and said update control is asserted.

9. The processor of claim 1 where during an initialization step such as 00 01, said gamma control input is not asserted, said update control is asserted, said data input is 0, and said delta input is 1.

10. The processor of claim 1 where during an ELP derivative step, said gamma control input is not asserted, said move control is asserted, and said update control is not asserted, said data input is 0, and said delta input is 0.

11. The processor of claim 1 where during an exponentiation step, said gamma control input is not asserted, said update control is asserted, said data input is 0, and said delta input is 1.

12. A processor for Reed-Solomon decoding, said processor having:
   at least one array comprising a first plurality of reconfigurable elementary units;
   a FIFO having a second plurality of storage registers;
   each said reconfigurable elementary unit having:
   a FIFO data input;
   a gamma input;
   a delta input;
   a gamma control input;
   a data input;
   a move control input;
   an update control input;
   an F1 register which generates an output by storing an input upon said clock;
   an F2 register which generates an output by storing an input upon said clock;
   a first multiplexer having an output selected by said gamma control, said output being said gamma input when said gamma control input asserted, and said FIFO data input at other times;
   a first Galois field multiplier generating the product of said first multiplexer output and said data input;
   a second Galois field multiplier generating as output the product of said delta input and said F2 output;
   a first Galois field adder having an output derived from the sum of said first multiplier output and said second multiplier, said first adder output coupled to said F1 input;
   a second multiplexer controlled by said move control input, said second multiplexer output being said first adder output when said move control input is asserted, and said data input at other times;
   a third multiplexer controlled by said update control input, said third multiplexer having an output coupled to said F2 input, said multiplexer selecting said F2 output when said update control input is asserted, and said second multiplexer output at other times.

13. The processor of claim 12 having an EraLP computation step where said gamma control input is asserted, said gamma input is 1, said delta input is 0, and said data input is erasure location information.

14. The processor of claim 12 where during a Corrected Syndrome computation step, said gamma control input is not asserted, said move control is asserted, said update control is not asserted, said data input is a syndrome term, and said FIFO input is a correction term.

15. The processor of claim 12 where during a KES computation step, said gamma control input is sequentially computed according to a KES computation, said move control is not asserted, and said update control is not asserted, and said KES computation generates said gamma input and said update_control input.

16. The processor of claim 12 where during an Errata Locator Polynomial (EraLP) to Error Locator Polynomial computation step, said gamma control input is asserted, said gamma is 1, said move control is asserted, said update control is not asserted, said data input is a corrected syndrome, and said delta input is 0.

17. The processor of claim 12 where during a Polynomial Evaluation step, said data input is 0, said gamma control input is not asserted, said delta input is 1, and said update control is asserted.

18. The processor of claim 12 where during an initialization step such as 00 01, said gamma control input is not asserted, said update control is asserted, said data input is 0, and said delta input is 1.

19. The processor of claim 12 where during an ELP derivative step, said gamma control input is not asserted, said move control is asserted, and said update control is not asserted, said data input is 0, and said delta input is 0.

20. The processor of claim 12 where said Galois Field Multiplier is a GF(16) multiplier.

21. An apparatus for performing Reed-Solomon decoding, said apparatus having:
a FIFO having a plurality d+1 of stages, the FIFO coupled to either a GF Generator or a Correction Register;
an upper array formed from a plurality d of Reconfigurable Elementary Units (REU), each REU having:
a data input;
a FIFO input, each said FIFO input uniquely coupled to a said stage of said FIFO;
a data output, each said data output coupled uniquely to an adjacent upper array REU said data input;
a gamma input;
a gamma control input;
a move control input;
an update control input;
said upper array having all said REU gamma inputs forming a gamma input bus;
said upper array having all said REU gamma control lines coupled together;
said upper array having all said move control inputs coupled together;
a lower array formed from a plurality d+1 of Reconfigurable Elementary Units (REU), each REU having:
a data input;
a FIFO input, each said FIFO input uniquely coupled to a said stage of said FIFO;
a data output, each said data output coupled uniquely to an adjacent lower array REU said data input;
a gamma input;
a gamma control input;
a move control input;
an update control input;
said upper array having all said REU gamma inputs forming a gamma input bus;
said upper array having all said REU gamma control lines coupled together;
said upper array having all said move control inputs coupled together;
whereby said FIFO is coupled to a source of syndromes and correction terms, said syndromes and correction terms processed to generate a plurality of values suitable for decoding a Reed Solomon codeword.

22. The apparatus of claim 21, where said processing including the steps:
computing an Errata Locator Polynomial (EraLP);
computing modified corrected syndromes;
offsetting said EraLP;
converting said modified syndrome into an Error Evaluator Polynomial (EEP);
converting said EraLP into an Error Locator Polynomial (ELP);
Evaluating said EEP;
Evaluating said ELP;
Forming ELP' by taking the derivative of said ELP;
Evaluating said ELP' using exponentiated Galois Field variables.

23. The processor of claim 21 where said d=16.

24. The processor of claim 21 where said Galois Field multiplier is a GF(16) multiplier.

25. The processor of claim 21 where said computing an EraLP step is performed during a first step using said upper array with:
said data_input coupled to said FIFO;
said gamma input set to 1;
said gamma control input set to 1;
said delta input set to 0.

26. The processor of claim 21 where said computing modified syndrome step is performed by loading syndromes into said FIFO, shifting correction terms into said FIFO while shifting said syndromes into said upper array, and on a last step multiplying each said upper array syndromes with said correction term.

27. The processor of claim 21 where said step of converting said modified syndrome into an Error Evaluator Polynomial (EEP) includes storing said modified syndrome into either said upper or said lower array, and having said associated array:
said data input set to 0;
said array data output coupled to said array data input;
said gamma is said gamma control input is sequentially computed according to a KES computation;
said move control is not asserted;
said update control is not asserted;
and said KES computation generates said gamma input and said update_control input.

28. The processor of claim 21 where said step of converting said EraLP into an Error Locator Polynomial (ELP) includes storing said modified syndrome into either said upper or said lower array, a KES logic which has an input and generates said gamma and also said update control, whereas said associated array:
said data input is coupled to said lower array output and also said KES logic input;
said gamma control is asserted;
said move control is not asserted.

29. The processor of claim 21 where said evaluation step of said EEP or said ELP comprises placing said EEP or said ELP into either said upper or said lower array, and having said associated array:
   said data input set to 0;
   said delta input set to 1;
   said gamma control not asserted;
   said upper control asserted.

30. The processor of claim 12 where said forming ELP' by taking the derivative of said ELP step comprises placing said ELP in either said upper or said lower array with:
   said data input set to 0;
   said delta input set to 0;
   said gamma control input not asserted;
   said move control input asserted;
   said update control input not asserted.

31. The processor of claim 12 where said evaluating said ELP' using exponentiated Galois Field variables step comprises placing said ELP' in either said upper or said lower array with:
   said FIFO accepting GF elements from a GF generator;
   said FIFO output coupled to said array data input;
   said delta input set to 0;
   said gamma control input not asserted;
   said update control input asserted.

* * * * *

UNITED STATES PATENT AND TRADEMARK OFFICE
CERTIFICATE OF CORRECTION

| | | |
|---|---|---|
| PATENT NO. | : 7,870,468 B1 | Page 1 of 2 |
| APPLICATION NO. | : 11/441596 | |
| DATED | : January 11, 2011 | |
| INVENTOR(S) | : Sundaram Vanka and Phanimithra Gangalakurthi | |

It is certified that error appears in the above-identified patent and that said Letters Patent is hereby corrected as shown below:

Column 2, line 32 "$C(x) = x^{n-k} D(x) + r(x) = q(x) \cdot G(x)$" should be changed to
$C(x) = x^{n-k} \cdot D(x) + r(x) = q(x) \cdot G(x)$ Column 2, line 57 "$E(x) = e_{j0} + e_{+j1}x + e_{j2}x^2 + \ldots + e_{k(t-1)}x^{t-1}$" should be changed to
$E(x) = e_{j0} + e_{j1}x + e_{j2}x^2 + \ldots + e_{k(t-1)}x^{t-1}$ Column 7, line 51 "the FIFO (a II correction term ($\alpha^P$)" should be changed to --the FIFO (a correction term ($\alpha^P$)--

Column 13, line 53 " $\Omega(\alpha^{k_i+l})$ " should be changed to $\Omega(\alpha^{k_i})$ Column 13, line 65 " $\tilde{\Omega}(\alpha^{k_i}) = \tilde{\omega}_0 + \tilde{\omega}_l \alpha^{k_i} + \ldots + \tilde{\omega}_{d-2}(\alpha^{k_i})^{d-2}$ " should be changed to
$\tilde{\Omega}(\alpha^{k_i}) = \tilde{\omega}_0 + \tilde{\omega}_1 \alpha^{k_i} + \ldots + \tilde{\omega}_{d-2}(\alpha^{k_i})^{d-2}$ Column 14, line 30 " $a_l(r+1) = a_{l+1}(r) \cdot \alpha_1(r) + b_1(r) \cdot \beta(r)$ " should be changed to
$a_l(r+1) = a_{l+1}(r) \cdot \alpha_l(r) + b_l(r) \cdot \beta(r)$ Column 14, line 49 " $\alpha_1(r) = 1$ and $\beta(r) = 0 (c_a = 1) c_a = 0 \Rightarrow \alpha_m(r) = m_l(r)$ " should be changed to $\alpha_l(r) = 1$ $\beta(r) = 0$ $(c_a = 1)$ $c_a = 0 \Rightarrow \alpha_m(r) = m_l(r)$ Column 14, line 51 " $a_1(r+1)$ " should be changed to $a_l(r+1)$ Column 14, line 57 " $f_l(r+1) = f_{l+1}(r) \cdot \phi_1(r) + g_l(r) \cdot \psi(r)$ " should be changed to
$f_l(r+1) = f_{l+1}(r) \cdot \phi_l(r) + g_l(r) \cdot \psi(r)$ Signed and Sealed this
Twentieth Day of September, 2011

David J. Kappos
*Director of the United States Patent and Trademark Office*

CERTIFICATE OF CORRECTION (continued)
U.S. Pat. No. 7,870,468 B1

Column 15, line 4 " $a_1(r+1) = a_{l+1}(r) \cdot \alpha_1(r) + b_l(r) \cdot \beta(r)$ " should be changed to
$a_l(r+1) = a_{l+1}(r) \cdot \alpha_l(r) + b_l(r) \cdot \beta(r)$ Column 15, line 37 " $f_l(r+1) = f_{l+1}(r) \cdot \phi_1(r) + g_l(r) \cdot \psi(r)$ " should be changed to
$f_l(r+1) = f_{l+1}(r) \cdot \phi_l(r) + g_l(r) \cdot \psi(r)$ Column 15, line 47 "for all $1 < s$" should be changed to
for all $l < s$ Column 15, line 57 " $f_1(r+1) = f_{l+1}(r)$ " should be changed to
$f_l(r+1) = f_{l+1}(r)$ Column 16, line 5 " $a_l = b_l l = 0,1,...,d-2$ " should be changed to
$a_l = b_l \quad l = 0,1,...,d-2$ Column 16, line 7 " $f_l = g_l l = 0,1,...,d-2$ " should be changed to
$f_l = g_l \quad l = 0,1,...,d-2$ Column 17, line 7, after " $a_l(r+1) = a_{l+1}(r) \cdot \alpha(r) + b_l(r)$ " insert
--and $b_l(r+1) = b_l(r)$ -- on the following line.

Claim 1, line 57 "where during an EraLP II" should be changed to
--where during an EraLP--

UNITED STATES PATENT AND TRADEMARK OFFICE
CERTIFICATE OF CORRECTION

PATENT NO. : 7,870,468 B1
APPLICATION NO. : 11/441596
DATED : January 11, 2011
INVENTOR(S) : Sundaram Vanka and Phanimithra Gangalakurthi It is certified that error appears in the above-identified patent and that said Letters Patent is hereby corrected as shown below:

Column 2, line 32 "$C(x) = x^{n-k} D(x) + r(x) = q(x) \cdot G(x)$" should be changed to
$C(x) = x^{n-k} \cdot D(x) + r(x) = q(x) \cdot G(x)$ Column 2, line 57 "$E(x)=e_{j0}+e+_{j1}x+e_{j2}x^2+...+e_{k(t-1)}x^{t-1}$" should be changed to
$E(x)=e_{j0}+e_{j1}x+e_{j2}x^2+...+e_{k(t-1)}x^{t-1}$ Column 7, line 51 "the FIFO (a II correction term ($\alpha^P$)" should be changed to --the FIFO (a correction term ($\alpha^P$)--

Column 13, line 53 " $\Omega(\alpha^{k_i+i})$ " should be changed to $\Omega(\alpha^{k_i})$ Column 13, line 65 " $\tilde{\Omega}(\alpha^{k_i}) = \tilde{\omega}_0 + \tilde{\omega}_1\alpha^{k_i} + ...+ \tilde{\omega}_{d-2}(\alpha^{k_i})^{d-2}$ " should be changed to
$\tilde{\Omega}(\alpha^{k_i}) = \tilde{\omega}_0 + \tilde{\omega}_1\alpha^{k_i} + ...+ \tilde{\omega}_{d-2}(\alpha^{k_i})^{d-2}$ Column 14, line 30 " $a_i(r+1) = a_{i+1}(r) \cdot \alpha_i(r) + b_i(r) \cdot \beta(r)$ " should be changed to
$a_l(r+1) = a_{l+1}(r) \cdot \alpha_l(r) + b_l(r) \cdot \beta(r)$ Column 14, line 49 " $\alpha_i(r) = 1$ and $\beta(r) = 0 (c_a = 1) c_a = 0 \Rightarrow \alpha_m(r) = m_l(r)$ " should be changed to
$\alpha_l(r) = 1$ $\beta(r) = 0$ $(c_a = 1)$ $c_a = 0 \Rightarrow \alpha_m(r) = m_l(r)$ Column 14, line 51 " $a_1(r+1)$ " should be changed to $a_l(r+1)$ Column 14, line 57 " $f_i(r+1) = f_{i+1}(r) \cdot \phi_i(r) + g_i(r) \cdot \psi(r)$ " should be changed to
$f_l(r+1) = f_{l+1}(r) \cdot \phi_l(r) + g_l(r) \cdot \psi(r)$ This certificate supersedes the Certificate of Correction issued September 20, 2011.

Signed and Sealed this
Eighteenth Day of October, 2011

David J. Kappos
*Director of the United States Patent and Trademark Office*

Column 15, line 4 "$a_1(r+1) = a_{l+1}(r) \cdot \alpha_1(r) + b_l(r) \cdot \beta(r)$" should be changed to
$a_l(r+1) = a_{l+1}(r) \cdot \alpha_l(r) + b_l(r) \cdot \beta(r)$ Column 15, line 37 "$f_l(r+1) = f_{l+1}(r) \cdot \phi_1(r) + g_l(r) \cdot \psi(r)$" should be changed to
$f_l(r+1) = f_{l+1}(r) \cdot \phi_l(r) + g_l(r) \cdot \psi(r)$ Column 15, line 47 "for all 1 < *s*" should be changed to
for all $l < s$ Column 15, line 57 "$f_1(r+1) = f_{l+1}(r)$" should be changed to
$f_l(r+1) = f_{l+1}(r)$ Column 16, line 5 "$a_l = b_l l = 0,1,...,d-2$" should be changed to
$a_l = b_l \quad l = 0,1,...,d-2$ Column 16, line 7 "$f_l = g_l l = 0,1,...,d-2$" should be changed to
$f_l = g_l \quad l = 0,1,...,d-2$ Column 17, line 7, after "$a_l(r+1) = a_{l+1}(r) \cdot \alpha(r) + b_l(r)$" insert
--and $b_l(r+1) = b_l(r)$ -- on the following line.

Column 19, line 57 (Claim 2, line 1) "where during an EraLP II" should be changed to
--where during an EraLP--